United States Patent
Kronmiller et al.

(10) Patent No.: US 7,155,440 B1
(45) Date of Patent: Dec. 26, 2006

(54) HIERARCHICAL DATA PROCESSING

(75) Inventors: Tom Kronmiller, Chapel Hill, NC (US); Steven Teig, Menlo Park, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 433 days.

(21) Appl. No.: 10/443,556

(22) Filed: May 21, 2003

Related U.S. Application Data

(63) Continuation of application No. 10/426,238, filed on Apr. 29, 2003.

(60) Provisional application No. 60/466,569, filed on Apr. 29, 2003.

(51) Int. Cl.
*G06F 17/30* (2006.01)

(52) U.S. Cl. .............. 707/100; 707/101; 707/102; 707/103 R; 707/104.1

(58) Field of Classification Search ............ 707/102, 707/100, 101, 103 R, 104.1
See application file for complete search history.

(56) References Cited

U.S. PATENT DOCUMENTS

| | | | | |
|---|---|---|---|---|
| 4,860,201 A | * | 8/1989 | Stolfo et al. | 712/11 |
| 5,319,779 A | * | 6/1994 | Chang et al. | 707/3 |
| 5,430,869 A | | 7/1995 | Ishak et al. | |
| 5,659,725 A | * | 8/1997 | Levy et al. | 707/3 |
| 5,659,728 A | * | 8/1997 | Bhargava et al. | 707/2 |
| 5,867,649 A | * | 2/1999 | Larson | 709/201 |
| 5,915,254 A | * | 6/1999 | Nakayama et al. | 707/203 |
| 5,956,257 A | | 9/1999 | Ginetti et al. | |
| 5,978,789 A | * | 11/1999 | Griffin et al. | 707/2 |
| 6,009,251 A | | 12/1999 | Ho et al. | |
| 6,029,195 A | * | 2/2000 | Herz | 725/116 |
| 6,157,955 A | * | 12/2000 | Narad et al. | 709/228 |
| 6,334,125 B1 | * | 12/2001 | Johnson et al. | 707/3 |
| 6,401,117 B1 | * | 6/2002 | Narad et al. | 709/223 |
| 6,421,730 B1 | * | 7/2002 | Narad et al. | 709/236 |
| 6,496,944 B1 | * | 12/2002 | Hsiao et al. | 714/15 |
| 6,625,611 B1 | * | 9/2003 | Teig et al. | 707/102 |
| 6,625,689 B1 | * | 9/2003 | Narad et al. | 711/110 |
| 6,662,358 B1 | * | 12/2003 | Berry et al. | 717/128 |

(Continued)

OTHER PUBLICATIONS

U.S. Appl. No. 10/426,238, filed Apr. 29, 2003, Kronmiller et al., Related Application.

(Continued)

*Primary Examiner*—Frantz Coby
(74) *Attorney, Agent, or Firm*—Stattler, Johansen & Adeli, LLP

(57) ABSTRACT

Some embodiments of the invention provide a method for processing a hierarchical data structure that includes a parent data set and first and second child data sets of the parent data set. The parent and first and second child data sets includes several data tuples. From the second child data set, the method identifies a first data tuple that is not in the first child data set and that is relevant for the processing of the data tuples within the first child data set. The method then assigns the first data tuple to the first child data set and then processes the first child data set based on the data tuples included in the first child data set and assigned to the first child data set. In some embodiments, the method also identifies, from the parent data set, a second data tuple that is not in the first child data set and that is relevant for the processing of the data tuples within the first child data set. The method assigns the identified second data tuple to the first child data set, and processes the first child data set based on this data tuple.

18 Claims, 15 Drawing Sheets

U.S. PATENT DOCUMENTS

| | | | | |
|---|---|---|---|---|
| 6,701,338 B1 * | 3/2004 | Narad et al. | ............... | 708/525 |
| 6,859,841 B1 * | 2/2005 | Narad et al. | ............... | 709/236 |
| 6,889,226 B1 * | 5/2005 | O'Neil et al. | ............... | 707/100 |
| 7,031,956 B1 * | 4/2006 | Lee et al. | ............... | 707/3 |
| 7,072,807 B1 * | 7/2006 | Brown et al. | ............... | 703/1 |
| 2001/0013087 A1 | 8/2001 | Ronstrom | | |
| 2002/0048763 A1 * | 4/2002 | Penn et al. | ............... | 435/6 |
| 2002/0120914 A1 * | 8/2002 | Gupta et al. | ............... | 716/17 |
| 2002/0133784 A1 * | 9/2002 | Gupta et al. | ............... | 716/1 |
| 2003/0005103 A1 * | 1/2003 | Narad et al. | ............... | 709/223 |
| 2003/0016770 A1 * | 1/2003 | Trans et al. | ............... | 375/346 |
| 2003/0046423 A1 * | 3/2003 | Narad et al. | ............... | 709/238 |
| 2003/0061332 A1 * | 3/2003 | Narad et al. | ............... | 709/223 |
| 2003/0086515 A1 * | 5/2003 | Trans et al. | ............... | 375/346 |
| 2003/0194704 A1 * | 10/2003 | Penn et al. | ............... | 435/6 |
| 2004/0113953 A1 * | 6/2004 | Newman | ............... | 345/853 |
| 2004/0143655 A1 * | 7/2004 | Narad et al. | ............... | 709/223 |
| 2004/0148382 A1 * | 7/2004 | Narad et al. | ............... | 709/223 |
| 2004/0225952 A1 * | 11/2004 | Brown et al. | ............... | 714/819 |
| 2005/0091576 A1 * | 4/2005 | Relyea et al. | ............... | 715/502 |
| 2005/0186933 A1 * | 8/2005 | Trans | ............... | 455/296 |
| 2006/0106585 A1 * | 5/2006 | Brown et al. | ............... | 703/1 |
| 2006/0111880 A1 * | 5/2006 | Brown et al. | ............... | 703/1 |

OTHER PUBLICATIONS

U.S. Appl. No. 10/443,623, filed May 21, 2003, Kronmiller et al., Related Application.

U.S. Appl. No. 10/426,238, filed Apr. 29, 2003, Kronmiller et al., Non-Final Rejection of Related Application dated Oct. 7, 2005.

U.S. Appl. No. 10/443,623, filed Jun. 30, 2004, Kronmiller et al., Non-Final Rejection of Related Application dated Jan. 31, 2006.

* cited by examiner

Figure 16: Figure 16A / Figure 16B two instances of the same large cell

HIERARCHICAL DATA PROCESSING

CLAIM OF BENEFIT TO PRIOR APPLICATIONS

This application is a continuation application of United States Patent Application entitled "Hierarchical Data Processing," filed on Apr. 29, 2003, and having Ser. No. 10/426,238. This patent application also claims the benefit of U.S. Provisional Patent Application entitled "Hierarchical Data Processing," filed on Apr. 29, 2003, and having Ser. No. 60/466,569. Both U.S. patent application Ser. No. 10/426,238 and U.S. Provisional Patent Application 60/466,569 are incorporated herein by reference.

FIELD OF THE INVENTION

The present invention is directed towards hierarchical data processing.

BACKGROUND OF THE INVENTION

To process large designs quickly, electronic design automation ("EDA") tools typically consider a variety of options. These options include (1) using more efficient algorithms to do the computations, (2) using more efficient data organization and commands to minimize loads and saves, (3) using multiple CPU's, and (4) taking advantage of the hierarchical nature of the data.

Data organization can entail organizing the data for the fastest access (e.g., using search trees instead of lists), minimizing access to disk, representing the data by using the fewest bytes possible even at the cost some decoding, and minimizing repeated visits to the same data. These considerations are all a consequence of the system memory architecture, where even fetching values from memory into registers is slow compared to the speed of the CPU. Some of these guidelines may be at odds with other requirements (e.g., using 64-bit pointers to gain capacity or 64-bit integers to avoid overflow and underflow problems in arithmetic both increase the volume of data).

There are two main variants for parallel computing. These are threaded computing on an SMP machine and distributed computing on a LAN. A program designed for distributed computing can operate on an SMP machine, but a threaded program will not operate across a LAN. Communications costs between different parts of the computation are vastly higher for distributed computation, as is the cost of launching a new process (compared with the cost of launching a thread). However, certain problems are common to both, such as indeterminism and load balancing.

The load-balancing problem is that of ensuring that all the available processors are busy as concurrently and as equally as possible. Ideally, every processor is 100% busy until the job completes, then all are finished at the same time. On an SMP machine this involves assigning each processor the same amount of computation. In a distributed environment, it involves assigning each processor variable amounts of computation, which happen to consume the same amount of real time (since the processors will not in general be the same speed). Practical solutions will depend on the breakdown of the tasks, with some factors being the number of tasks per processor (few vs. many) and the relative lengths of the tasks (all roughly the same duration, wildly varying durations).

Hierarchical processing of large designs is a key method of improving performance and capacity. In some sense, use of hierarchy is an artifact of the high price of computation. If checking and flattening algorithms were fast enough, and if memory was cheap enough, EDA tools would just flatten everything and run the algorithms directly. That would avoid all the complexity involved in handling the hierarchy, and would allow the tools to process the data in a form most close to the actual chip to be fabricated. The main flaw in the theory (for the world with sufficiently fast processors) has to do with error reporting, since an error in a leaf cell should be reported once against the cell, rather than many times at each instance. The main flaw in practice is that tools cannot flatten and run fast enough. Even postulating EDA tools would treat memory cells/arrays specially, it is unlikely flat processing would be good enough.

A clean hierarchy is one where no instances overlap with each other and no geometry from a parent of an instance modifies the netlist or devices of a child. Ideally, very little geometry from a parent would interact with a child at all. These would make it relatively easy to process each cell and the later just 'patch' the results for the instances. In practice, overlapping cell placements are very common. Geometry causing changes to devices or netlists inside child cells is also relatively common.

Several prior EDA tools perform hierarchical operations in a bottom-up fashion. Two prior bottom-up hierarchical operations are the shadow method and the grabbing method. The first-order pseudo-code for both these operations is the same. This pseudo-code is as follows:

(1) load data in hierarchial form
(2) let N be the maximum depth of any cell in the hierarchy
(3) foreach command in the rules file, do
(4) foreach depth from N down to 0
(5) foreach cell at this depth in parallel, do
(6) execute the current command on the current cell As indicated in this pseudo-code, the shadow and grabbing methods both process each command on each cell of the hierarchical data structure in a bottom-up fashion. In other words, both these methods process each command first for each cell at the highest depth level, then for each cell at the next-highest depth level, and so on until reaching the root cell.

Tools that use the shadow method write flat processing codes independently of any hierarchy code and independently of any parallel processing code. The hierarchy manager has the responsibility for both hierarchy and parallelization. Specifically, the shadow method handles hierarchical interactions as follows. Prior to the main loop above at line (3), "shadows" (i.e., geometries close enough to instances to interact with them) are projected down from parents into children, and the data intersecting the shadows in the child is separated from the rest of the data of the child. Next, at line (6), that data is ignored, and a new step is added in which that data is passed up to the parent and distributed around each instance as if it had been part of the parent. Hence, a more-detailed pseudo code for the shadow operation is as follows.

(1) load data in hierarchial form
(2) foreach cell in top-down order, do
(3) separate cell's shadowed region from cell's clear region
(4) propagate parent shadows plus cell's shadows into cell's children
(5) let N be the maximum depth of any cell in the hierarchy
(6) foreach command in the rules file, do
(7) foreach depth from N down to 0
(8) for each cell at this depth in parallel, do
(9) instantiate all this cell's children's shadowed
(10) regions at part of this cell's clear region

(11) execute the current command on the clear region of current cell

Under the shadow method, data shadowed at any instance will be promoted into the sites of every instance. In addition, rather than doing the straightforward depth-first loops in parallel, the hierarchy can be treated as a dependency graph and each parent started as soon as its children finish, instead of waiting for each child at that level. Under this approach, multiple passes are made through the whole dataset. Also, the decision about which data to promote to the parent can take into account both the shadow and the particular command being run.

The grabbing method differs with the shadow method in the way that its processes interaction regions. In the grabbing method, the entire cell is checked but any errors are deferred instead of output. Parents reach down into their children and pull out the data that interacts with them, subtracting any false errors previously generated in the child, which this may clear. The following is the detailed pseudo-code for the grabbing method:

(1) load data in hierarchical form
(2) let N be the maximum depth of any cell in the hierarchy
(3) foreach command in the rules file, do
(4) foreach depth from N down to 0
(5) foreach cell at this depth in parallel, do
(6) identify in each child the data shadowed by this cell
(7) instantiate that data in this cell
(8) execute the current command on this cell
(9) fix up any false errors from the child In the grabbing method, data shadowed at any instance is promoted only into locations where it is relevant. The observation about parallelization that was made for the shadow method can also be made for the grabbing method. Also, in the grabbing method, multiple passes are made through the whole dataset. In addition, the decision about which data to grab into the parent can be made by the command.

It is difficult to estimate on theoretical grounds whether grabbing should be faster or slower than the shadow method. The searching required for the actual grabbing might need to be recursive implying duplicated efforts. Storage of false errors for later fixup adds complexity. In theory, the grabbing method can make more intelligent decisions about which data get instantiated in the parents, because it effectively pulls in data in its own shadow rather than from the union of every shadow. This saves work. Both methods can use the command to guide their choice of data to grab or promote. This can theoretically allow each command to operate on a smaller dataset than if it picked up all the data needed by any command in the session.

Both the grabbing and shadow methods visit the dataset repeatedly, contrary to the performance recommendations. It is probably true that the cells closer to the root contain more data, on average, than cells closer to the bottom. So both methods are likely scheduling larger processing tasks at the end rather than at the beginning, contrary to our parallelization recommendation. The scheduling issue of large items last is aggravated by the migration of data from smaller cells into larger cells, which magnifies the difference.

SUMMARY OF THE INVENTION

Some embodiments of the invention provide a method for processing a hierarchical data structure that includes a parent data set and first and second child data sets of the parent data set. The parent and first and second child data sets includes several data tuples. From the second child data set, the method identifies a first data tuple that is not in the first child data set and that is relevant for the processing of the data tuples within the first child data set. The method then assigns the first data tuple to the first child data set and then processes the first child data set based on the data tuples included in the first child data set and assigned to the first child data set. In some embodiments, the method also identifies, from the parent data set, a second data tuple that is not in the first child data set and that is relevant for the processing of the data tuples within the first child data set. The method assigns the identified second data tuple to the first child data set, and processes the first child data set based on this data tuple.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

Figure 1:
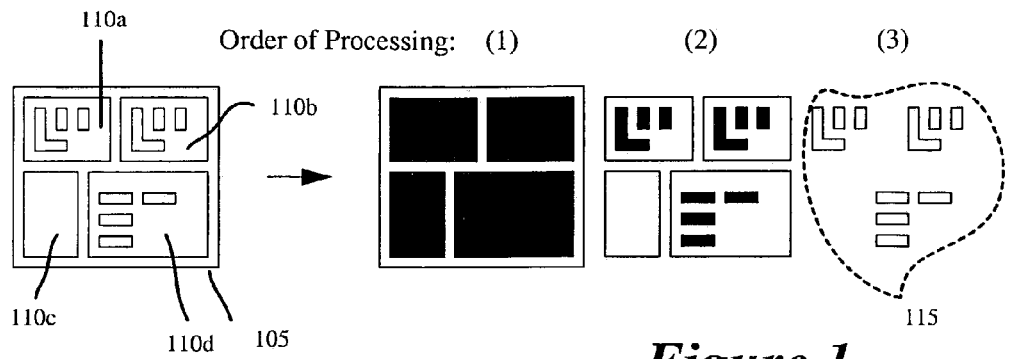
FIG. 1 presents an example that illustrates the general idea of pushing data from parent instances to child instances.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a top-down approach for performing hierarchical data processing. These embodiments push the interactions between parent and child data sets in a hierarchical data structure down into the child data sets instead of pulling them up into the parent data sets. Also, these embodiments address interactions between two data sets that are at the same level of hierarchy (i.e., two data sets that do not have a simple parent/child relationship). Specifically, when such data sets interact, some embodiments generally push the interaction data from the larger data set into the smaller data set. This methodology is named Robin Hood, famous for robbing from the rich and giving to the poor. This methodology results in more evenly distributed processing as it distributes data from the larger data sets to smaller data sets.

I. Definition

Before discussing different embodiments of the invention, several terms that will be used below need to be defined.

"Adopted child instance" is an instance that another instance adopts as its child instance.

"Bounding box" or "Bbox" of an item in a design refers to the boundary of the item or the smallest bounding polygon for the item.

A "cell" is the definition of a portion of a design. Cells range from trivially small (the cut rectangle of a via) to huge (an entire microprocessor). A design typically includes lots of cell instances that are connected together with wires. A single cell may appear as multiple cell instances in the same design. Examples of cells include electronic components (e.g., transistors, resistors, diodes, etc.), circuit components (e.g., gates, cells, memory units, arithmetic units, controllers, decoders, etc.), IP blocks, etc.

A "cell boundary" refers to a description of the border of the content of a cell. In the simplest form, a cell boundary is the smallest rectangle that would enclose all the geometry across all layers of the cell. More detailed versions can be maintained, identifying the minimum and maximum occupied layers and a more detailed shape surrounding the geometry (such as an "L" or a donut shape).

A "cell instance" refers to a specific use of a cell at a particular location in a design. The location often includes both a coordinate pair and an orientation. In the discussion below, the instances are at times mentioned as active participants that perform certain actions. In these cases, it is the processes associated with the instances that are performing these actions. In some embodiments that use an object-oriented model, each instance is an object with a set of data attribute and a set of processes (i.e., methods or functions). Hence, in these embodiments when an instance performs a certain action, it is the instance's methods that are performing the action.

"Child instance" refers to an instance that is defined within another instance, called a parent instance.

"Context" of a particular cell instance refers to the geometries and instances that neighbor the particular cell instance.

A "core" is synonym for instance core.

"Geometry" refers to data within the design that does not represent an instance of a cell. Wires are one type of geometry. Some embodiments view some other items in the design (such as pins and obstacles) as subsets of wires. Geometries in a design also include components that a designer individually specifies in the design.

"Gray data" is data visible to a particular unit of processing that is not actually being processed. Gray data is necessary to process correctly the white data, but otherwise it is ignored.

"Halo" is a region about an instance. This is the region in which interactions might occur between geometries and child instances within a cell instance and the geometries and instances outside the cell instance. Different types of the processing might require different halos.

"Halo polygon" refers to the region covered by the instance's core and the instance's halo.

A "hierarchical data structure" is a data structure that has several nodes, where some nodes are parent nodes and some nodes are child nodes. Each node is a data set. A node can be a child node of another node, and can also have child node or nodes of its own. A hierarchical data structures can have a root node, which is a node that does not have any parent node in the structure. Different hierarchical data structures define the relationship between the parent and child nodes differently. For instance, the parent nodes have references (e.g., pointers) to their child nodes in some cases, while in other cases, a parent node's child nodes are alternatively defined as part of a data set of the parent node.

A "hierarchical instance data structure" is a data structure where each node is an instance.

An "instance" is synonym for cell instance.

An "instance core" refers to the interior region of the instance. It is used to differentiate the interior of the instance from the instance's halo. In other words, instance core is used to reference the central region of an instance-plus-halo diagram, to emphasize that the region of the instance proper is being discussed but explicitly not the halo region around the instance.

"Native child instance" is a child instance that is part of a definition of a parent instance.

A "parent instance" is an instance that contains one or more instances, called child instances.

Two instances are peers when they are both native child instances of the same parent instance.

A "tree" is a hierarchical data structure that can be searched quickly by the process.

A "virtual pin" is a connection point placed at the end of a boundary (such as a hierarchical boundary) to represent the communication of specialized information across that border. For example, if a wire reached the edge of an instance, doing the checks inside the instance might require information about the wire outside the instance such as the identity of its net. The virtual pin at the border would be used to convey this additional information.

A "vpin" is a synonym for virtual pin.

"White Data" is data upon which processing is occurring and results are being reported.

II. Overview

Several embodiments are described below for an EDA-tool's use of the invention to process a hierarchical instance data structure that represents an IC design layout. This structure has multiple nodes, where each node corresponds to a particular instance within the design. The root node of this structure is the root instance that represents the entire design. The root instance has a number of instances and these instances appear as child instances of the root node in the hierarchical data structure. In turn, each of these child instances can have its own set of child instances, which can have their own child instances, and so on. Different embodiments use different techniques to define the relationship between parent and child instances. For example, in some embodiments, the parent instances have references to their child instances. Other embodiments might define a parent's child instances in an alternative manner as part of a child-instance data set of the parent instance.

Before describing how some embodiments process a hierarchical instance data structure, the conceptual framework for these embodiments will be explained.

A. Pushing Data from Parent To Child Data Sets

FIG. 1 presents an example that illustrates the general idea of pushing data from parent instances to child instances. This figure illustrates a top cell instance 105, four secondary cell instances 110a–d, and a few tertiary cell instances 115. The top instance 105 represents the whole design. Two of the secondary instances 110a and 110b are two instances of the same cell, while the two other secondary instances 110c and 110d are instances of two different cells. The tertiary instances 115 could be hierarchical children of their apparent parents, or they could be instances placed so that they overlap without regard to hierarchy.

Under the methodology of some embodiments, wires of the top instance 105 that overlap the secondary or tertiary instances are pushed into the secondary or tertiary instances, then the remainder of the top instance 105 is processed. Next, wires of the secondary instances 110 that overlap the tertiary instances 115 are pushed into those tertiary instances 115, and then the secondary instances 110 are processed. Finally, the tertiary instances 115 are processed.

B. Instances, Halos, and White and Gray Data

Figure 2:
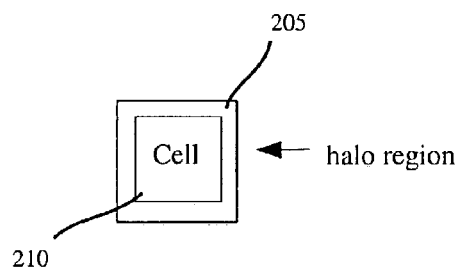
FIG. 2 presents a diagram that illustrates a halo of a cell instance

FIG. 2 presents a diagram that illustrates a halo 205 of a cell instance 210. The halo around a cell instance identifies the region in which interactions might occur between the content of a cell instance and the context of the cell instance. To simplify the drawings, the figures illustrate cell instances as rectangles and halos as rectilinear regions that apply to the whole rectangle of their cell instances. One of ordinary skill will realize that neither the cell instance nor its halo has to be a rectangle (e.g., the halos might have rounded off corners when the tool uses a Euclidean wiring model, or might have an octagonal shape when the tool uses an octilinear wiring model).

Figure 3:
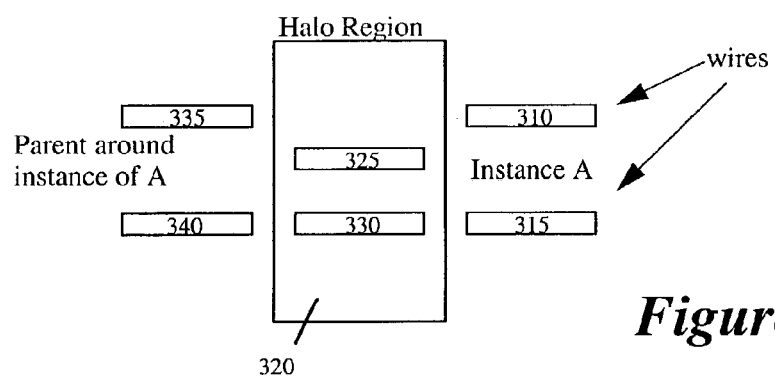
FIGS. 3 and 4 illustrate the types of interactions between wires within an instance, its halo, and outside its halo.

By definition, geometries and instances within a cell instance cannot interact with geometries and instances outside the halo. FIG. 3 presents an example that further elaborates on this point. This figure illustrates a cell instance A that has two wires 310 and 315. The halo 320 of the cell instance includes two wires 325 and 330, which should be considered in analyzing the wires 310 and 315. On the other hand, wires 335 and 340 are outside of the halo 320 of instance A, and therefore do not interact with wires 310 and 315 of the instance A.

In order to be more precise about what it means to push the data down into the smaller cell, the wires in the example illustrated in FIG. 3 are classified into the following three classes: (1) wires 310 and 315 in the instance A, (2) wires 325 and 330 in the surrounding parent which fall within the halo 320 of the instance A, and (3) wires 335 and 340 in the surrounding parent outside of the halo 320.

Figure 4:
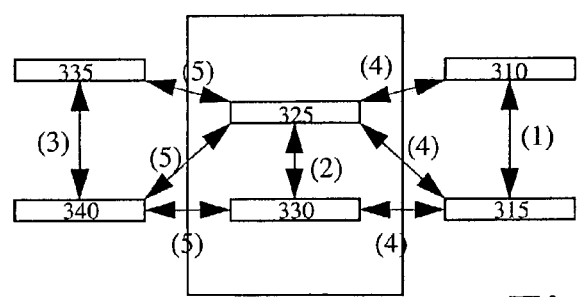

FIG. 4 illustrates that five types of interactions exist between these three categories of wires. These five types of interactions are: (1) the interaction of one wire of the instance with another wire of the instance (e.g., the interaction of wires 310 and 315 in the instance A), (2) the interaction of a wire from the instance's halo with another wire from the instance's halo (e.g., the interaction of wires 325 and 330 in the halo 320 of the instance A), (3) the interaction of a wire from the surrounding parent on another wire from the surrounding parent (e.g., the interaction of wires 335 and 340), (4) the interaction of a wire from the instance with a wire from the instance's halo (e.g., the interaction of wire 315 of the instance A and the wire 330 of the halo 320), and (5) the interaction of a wire from the surrounding parent with a wire from the instance's halo (e.g., the interaction of the wire 340 of the parent and the wire 330 of the instance's halo).

It is natural for the processing of the instance to include type (1) of interactions since that includes instance data exclusively. It is also natural for the processing of the parent to include types (3) and (5) since they include parent data exclusively. Theoretically items in type (2) can be processed either when the parent is processed or when the instance is processed: both parts of the program's execution will have the data available to do the processing. Since only parent data is involved, several embodiments described below choose to do the processing in the parent. However, other embodiments might perform the processing for type (2) interactions in the instance.

The Robin Hood methodology of some embodiments pushes the parent data that overlaps the core of the instance into the instance, so that the pushed data can be processed in the instance (i.e., treating the pushed data as a type (1) interaction). This methodology also pushes a copy of the parent data from the halo region of the instance into the instance so that the instance can process interactions in type (4). From the perspective of the instance A, the wires 310 and 315 are white data while 325 and 330 are gray data because they have been pushed into the instance only for purposes of processing interactions with data from the instance. (From the viewpoint of the parent, all of the wires 325, 330, 335 and 340 are white data.) Accordingly, when processing the instance examines interactions involving wires 310, 315, 325, and 330, some embodiments are careful not to examine results between wires 325 and 330. In other words, the general rule of these embodiments is that white—white interactions and white-gray interactions should be checked, but gray—gray interactions should be skipped.

Figure 5:
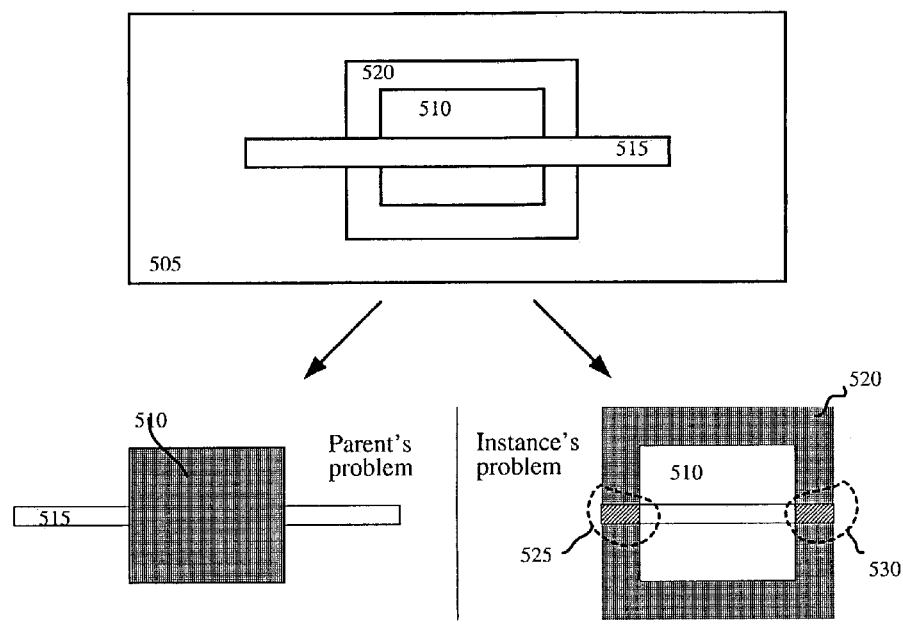
FIG. 5 presents a simple example that illustrates how data is pushed in a child instance from a parent instance, and how the data is classified as white and gray data.

FIG. 5 presents a simple example that illustrates how data is pushed in a child instance 510 from a parent instance 505, and how the data is classified as white and gray data. In this example, a wire 515 in the parent instance 505 crosses the child instance 510. As shown in FIG. 5, the problem that is analyzed for the parent instance 505 includes all the data except the data inside the child instance 510. All the data outside of the child instance 510 is white data for the parent instance's problem. The problem that is analyzed for the child instance 510 includes all the data in the child instance and in the halo 520 of the child instance. This halo includes segments 525 and 530 of the wire 515. These segments are gray data in the child instance's problem, while the remaining data in the child instance's interior is white data for this problem.

C. Interacting Instances

In the example illustrated in FIGS. 4 and 5, two instances did not interact at the same level of the hierarchy, even though the wires interacted with multiple instances. When two instances at the same level interact and one instance is more complex than the other, the Robin Hood methodology sends data from the more complex instance to the less complex instance. The data that is sent is from a region, in the larger instance, that can contain data that might interact with data in the smaller instance.

Figure 6:
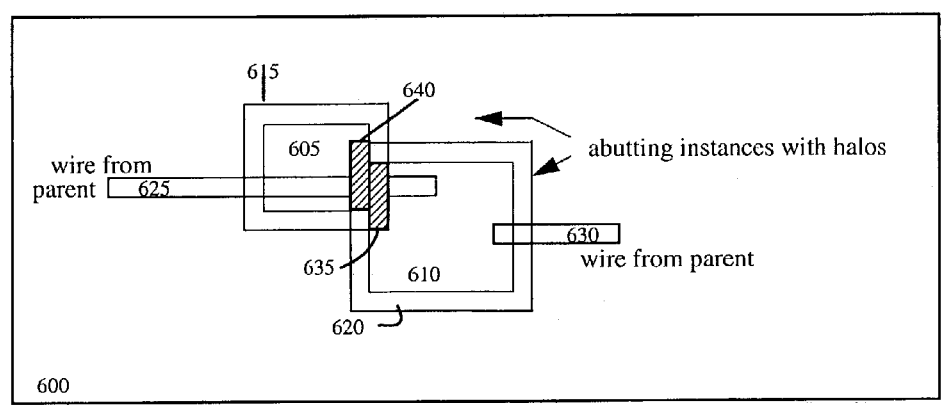
FIG. 6 presents an example that illustrates where to send data when instances at the same level of the hierarchy interact.

FIG. 6 presents an example that illustrates where to send data when instances at the same level of the hierarchy interact. This figure illustrates a parent cell instance 600, two child cell instances 605 and 610, two halos 615 and 620 about the child instances 605 and 610, a wire 625 that intersects both child instances, and a wire 630 that intersects only the larger child instance 610. The child instance 605 is less complex than the child instance 610.

Figure 7:
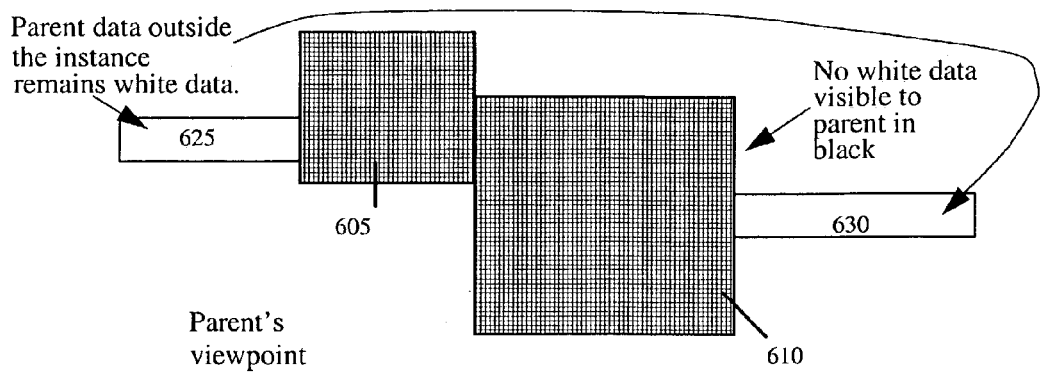
FIG. 7 illustrates the parent problem for the example illustrated in FIG. 6.

FIG. 7 illustrates the parent problem for the example illustrated in FIG. 6. As shown in FIG. 7, the parent's problem does not include any white data within the region covered by cells 605 and 610. The only white data in the parent's problem instance are the pieces of the wires 625 and 630 that do not overlap the two cells 605 and 610.

Figure 8:
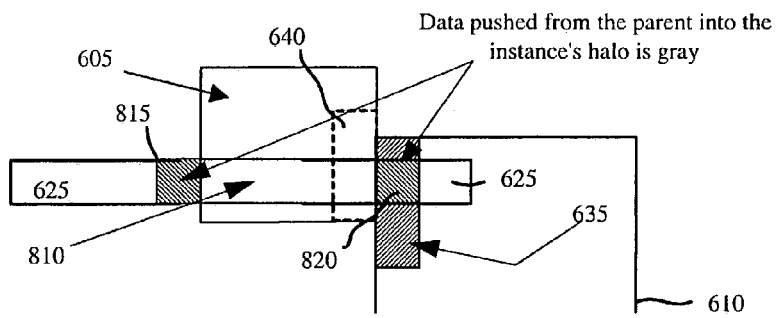
FIG. 8 illustrates the problem for the smaller child instance in FIG. 6.

FIG. 8 illustrates the problem for the smaller instance 605. As illustrated in FIGS. 6 and 8, the two instances 605 and 610 abut and their halos reach into each other. Hence, there might be data in region 635 of the larger instance 610 that might be relevant to the processing of the data in the smaller instance 605, and data in region 640 of the smaller instance 605 that might be relevant to the processing of the data in the larger instance 610.

To address these possible interactions, the data within region 635 of the larger instance 610 is pushed into the smaller instance 605 as gray data. Specifically, as shown in FIG. 8, the gray data for the smaller instance 605 includes (1) the data from the region 635 of the instance 610, and (2) the segments 815 and 820 of the wire 625 that fall into the halo 615 of the instance 605. Some embodiments mark all the gray data pushed into an instance (e.g., all segments 815 and 820 and the data in region 635 that are pushed into the instance 605) with the instance from which they originated, so that any reports that refers to the gray data can identify them as coming from the appropriate location even though it is being checked during processing of another instance.

In some embodiments, the parent instance 600 pushes the segments 815 and 820 of the wire 625 into the instance 605. The parent instance in some embodiments also directs the larger instance 610 to push the data in its region 635 into the smaller instance 605. As further described below, the parent instance accomplishes this by directing the larger instance 610 to adopt the smaller instance 605; after adopting the smaller instance 605, the larger instance will then determine whether any of its data falls with its adopted child instance 605, and hence will forward to the instance 605 any of its geometry data that falls within region 635. As shown in FIG. 8, the white data for the smaller instance 605 include (1) all the data 805 within instance 605, and (2) the wire 625's segment 810 that overlaps instance 605. In some embodiments, the parent instance 600 pushes the segment 810 into the problem of the instance 605.

Figure 9:
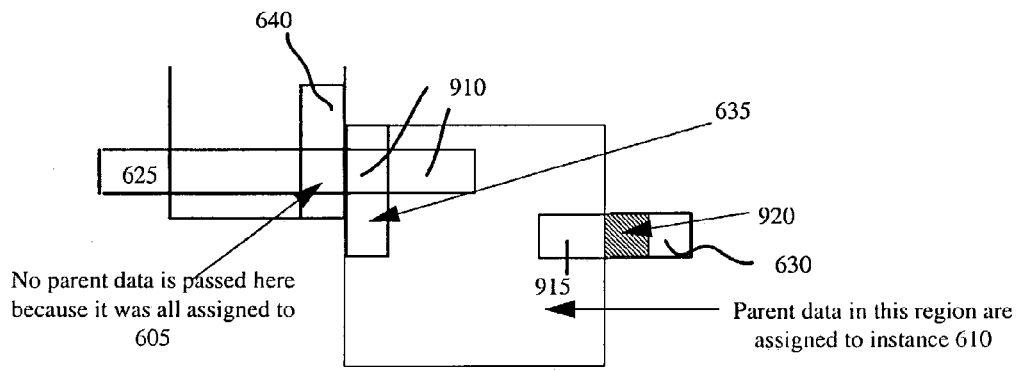
FIG. 9 illustrates the problem for the larger child instance in FIG. 6.

FIG. 9 illustrates the problem for the larger instance 610. As shown in this figure, the white data in this problem include (1) all the data within cell 610, (2) the segment 910 of wire 625, and (3) the segment 915 of wire 630. The parent instance 600 pushes the segment 910 and 915 into the problem of the instance 610, as these segments are the portions of wires 625 and 630 that overlap with the instance 610. The data within region 635 of the instance 610 is part of the white data of this instance, even though this data gets passed as gray data to the instance 605. The gray data for the problem instance of the instance 610 includes the segments 920 of the wire 630 that falls into the halo 620 of the instance 610. The parent instance marks the gray data that it pushes into the instance 610 with the instance (in this case, the parent cell instance) from which the data originated, and, as mentioned above, this marking can be used during reporting to identify the instance from which the gray data was sent. The portion of the wire 625 that falls in the halo 620 of the instance 610 is not part of the gray data of the instance 610, as the parent instance assigned this portion to instance 605.

D. Messages

When a parent instance is being processed, the parent instance knows of the child instances and geometries within the parent instance. In some embodiments, the parent instance does not know of the content of its child instances. Their content will not become available until later when the child instances are eventually processed.

So, in a situation where a parent instance detects that a first child instance has to examine its possible interaction with a second child instance, the parent instance will send a relay message "relay message" to the first child instance to adopt the second child instance. The parent instance then sends a notification message to the second child instance, informing it to expect a message from the first child instance. The parent also sends a "contribution message" to a particular child instance when the parent wants to push its own data to the particular child instance.

Figure 10:
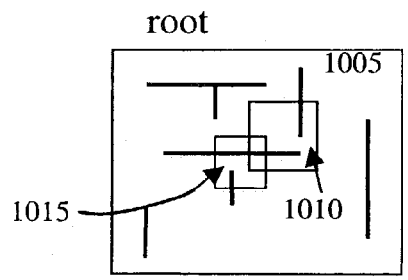
FIG. 10 illustrates a root with two overlapping instances.

These messages are further described by reference to FIG. 10. This example illustrates a root instance 1005. A root instance represents the entire portion of the design that is being analyzed at a particular time by an EDA tool. A root instance might be the entire design or it might only be a portion of the design. The root 1005 contains two cell instances 1010 and 1015 and several wires. The instance 1010 is larger and more complex than the instance 1015. The root 1005 passes the wires that overlap the cell instances 1010 and 1015 down to these instances through contribution messages to these two instances.

The root also detects that the instances 1010 and 1015 interact with each other. To have the smaller instance 1015 process data from the region of the larger instance 1010 that interacts with the smaller instance 1015, the root sends a relay message to the larger instance 1010. This relay message directs the larger instance 1010 to adopt the smaller instance 1015. The root also sends the smaller instance 1015 a notification message to expect data from the larger instance 1010. From the cell instance 1010, the cell instance 1015 will eventually receives a message that contains the instance 1010's data in the interacting region. Upon receiving this message, the instance 1015 can run.

In this document, the following notation is used for passing messages:

A→B indicates that the instance A sends instance B a message,

B←A indicates that B receives a message from A.

The content of the message, if given, could be listed after a colon, e.g., A→B: A's geometries which intersect B and B's halo
A→B: B→C: B adopt C is a relay message from A to B to adopt C. This notation can be shortened into: A→B→C: B adopt C.
A→C←B: C wait for message from B.

Thus far, the messaging has been described as sending messages directly to the instances. This is a valid conceptual model. However, some embodiments define one message handler for each cell that has at least one instance in the design. This message handler then receives and handles the messages sent to each instance of the cell, as further described below.

Two other messages that a parent instance sends for each of its native child instances is a new-instance message and a notification message. The parent instance sends these messages before sending any relay or contribution messages. The message handler of a child instance's cell receives the new-instance message and its follow-up notification message, and, in response, prepares for receiving messages for the child instance. The message handling process will be further described below.

E. Instance Contexts

The message-handler process described below also account for the context of an instance. Specifically, the message handler of a cell X does not start processing an instance I of the cell X when it has previously started processing another instance I' of the cell X that has the same context as the instance I. In this situation, the message handler simply reports the result from the processing of the previously started instance I' for the instance I.

Different embodiments keep track of the context of an instance that they start processing differently. For instance, in some embodiments, the message handler computes a hash value for an instance I'. Computing a hash value for an instance is further described below. After computing the hash value, the message handler then stores the computed hash value in a hash table. When the message handler in these embodiments completes the processing of the instance I', it then stores a reference in the hash table to the stored results of the processing of the instance I'.

When the message handler wants to start processing instance I, the message handler computes a hash value from the messages that it received for the instance I. It then determines whether the computed hash value has already been stored in the hash table. When it discovers that this value has previously been stored, it then foregoes calling the process for examining the instance I. Instead, the message handler uses the results of the processing of the previously started instance I' for the instance I, if the processing of the instance I' has been completed. Alternatively, if the processing of the instance I' has not yet been completed, the message handler waits until the previously started processing finishes, and then reports the results of this processing for the instance I.

Different embodiments compute hash values different differently. Below is the pseudo code for how some embodiments compute a hash value for an instance I of cell X.
Function ComputeHash(Instance I):
  gather all the adopted geometries and adopted instances for I,
  do a coordinate transform on the adopted geometries and adopted instances so they are now relative to a default origin for all the instances of the same cell,
  initialize Result
  obtain a canonical representation for the transformed, adopted geometries,
  foreach geometry,
    foreach coordinate in the geometry's description, generate a hash value based on the coordinate and accumulate this value iin Result,
  sort adopted instances by master and location,
  foreach adopted instance according to the sorted order, generate a hash value based on the instance ID and transformed location with respect to instance I, and accumulate this value in Result,
  return Result
End.

As illustrated in the pseudo code above, the Compute-Hash function initially identifies all adopted geometries and adopted instances for the instance I. It then performs a coordinate transform on the adopted geometries and adopted instance, so that they are defined with respect to the same coordinate system for all instances of the cell X. The function then initializes a parameter called Result.

The function then canonicalizes the representation of the transformed, adopted geometries. This canonicalization adjusts any input geometries so that all equivalent inputs produce the same output. In some embodiments, this canonicalization entails removing overlaps in the adopted geometries, sorting outputs in a standard fashion, and splitting and merging abutting geometries in a standard fashion. A typical way to do perform these operations is to run the maximally horizontal algorithm on the adopted geometries. J. Ousterhout, "Corner Stitching: A Data Structuring Technique for VLSI Layout Tools," IEEE Trails. Computer-Aided Design, vol. CAD-3, no. 1, pp. 87–100, 1984.

After performing the canonicalization, the function computes a hash value for each coordinate of each adopted geometry and accumulates these values in Result. It then sorts the adopted instances by their cell and location. The function then computes a hash value for each adopted instance according to the sorted order. The function aggregates these hash values in Result. After computing the hash value for all adopted instances and aggregating these values in Result, the function returns Result as its computed hash value.

III. Overall Flow

Figure 11:
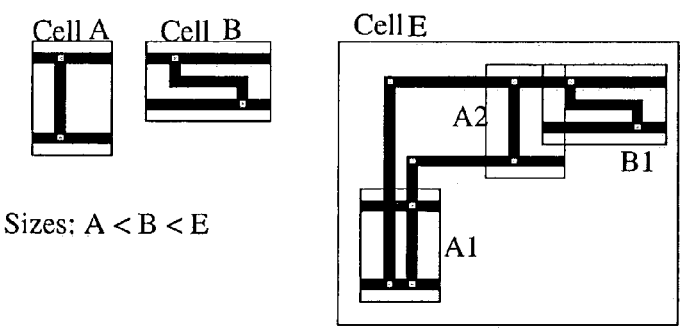
FIGS. 11–13 illustrate an example of the use of some embodiments of the invention in an IC design.
Figure 12:
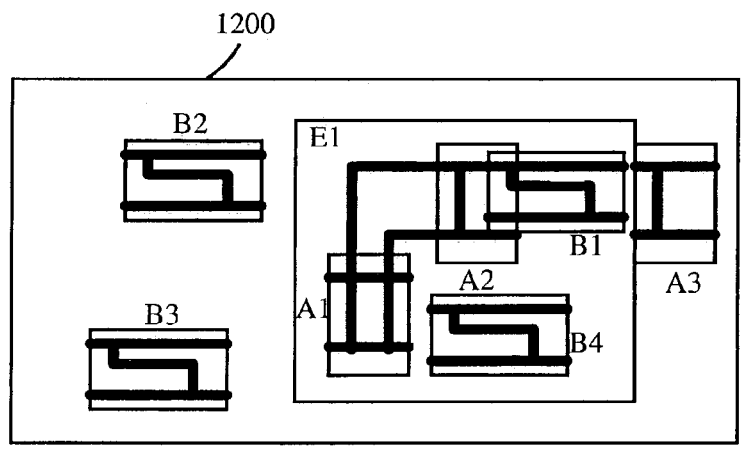
Figure 13:
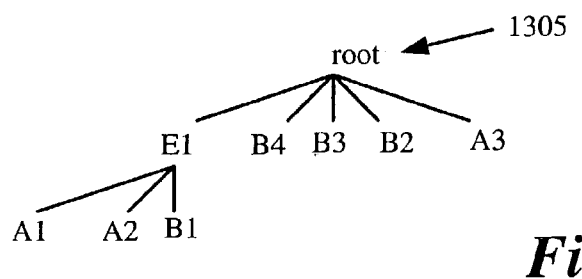

Several more detailed embodiments of the invention will now be described by reference to FIGS. 10–24. The description below refers to an example of an IC design that is illustrated in FIGS. 11–13. FIG. 11 illustrates the cells that are involved in this example. These cells include cells A, B, and E. Cell A is smaller than cell B, which is smaller than cell C. Also, cell E includes two instances (called $_{A1}$ and A2) of cell A and one instance (called B1) of cell B. FIG. 12 illustrates a design 1200 that includes one instance E1 of cell E, three instances B2, B3, and B4 of cell B, and one instance A3 of cell A. This figure also illustrates the three instances A1, A2, and B1 in the instance E1. The entire design 1200 is called a root cell instance.

FIG. 13 illustrates a hierarchical data structure 1300 that can be used to hierarchically store the instances illustrated in FIG. 12. As shown in FIG. 13, this data structure is three levels deep. This structure has several nodes, where each node is one cell instance in the design. In this structure, some nodes are parents of other nodes and some nodes are child nodes of other nodes. In other words, this structure illustrates that some instances are parents of other instances, and some instances are children of other instances. In some embodiments, an instance that is a parent of one or more other instances knows about its child instances but does not know about the content (e.g., the child instances and wiring) of its child instances.

In FIG. 13, the root node of the hierarchical tree 1300 is the root instance 1305 that represents the entire design 1200 illustrated in FIG. 12. This root instance 1305 is at the lowest level (level 0) 1310 of the hierarchy. This root node 1305 is the parent for five child nodes. In other words, the root instance 1305 is the parent of the five instances A3, B2, B3, B4, and E1. In the embodiments described below, the root instance 1305 does not know of the child instances within the instances A3, B2, B3, B4, and E1.

Each of the five instances A3, B2, B3, B4, and E1is represented by a node at the second-level (level 1) 1315 of the hierarchical data structure 1300. The instances A1, A2, and B1 are at the last level (level 2) 1320 of this hierarchy. These three instances are children of the instance E1.

Each of the instances illustrated in FIGS. 12 and 13 includes one or more wires that connect the pins and sub-instances inside the cells. In some embodiments, the geometries (such as wires) inside each instance are stored with the instance, and are not otherwise explicitly represented as nodes in the hierarchical data structure 1300. One of ordinary skill will realize that other embodiments might store these geometries in a different manner.

Figure 14A:
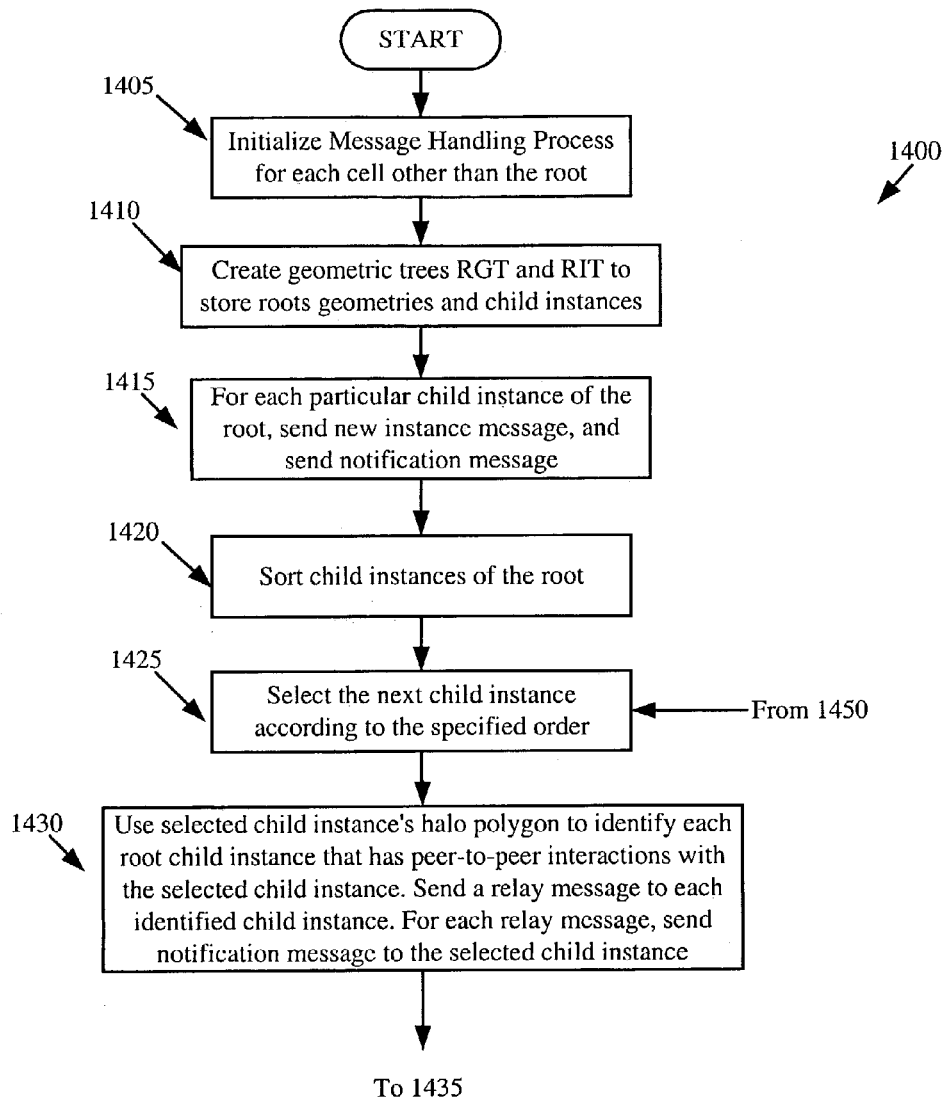
FIG. 14 illustrates a process that starts the processing of a hierarchical data structure by initializing a message handling process for each cell that has at least one instance in the hierarchical data structure, and processing the root node of the hierarchical data structure.
Figure 14B:
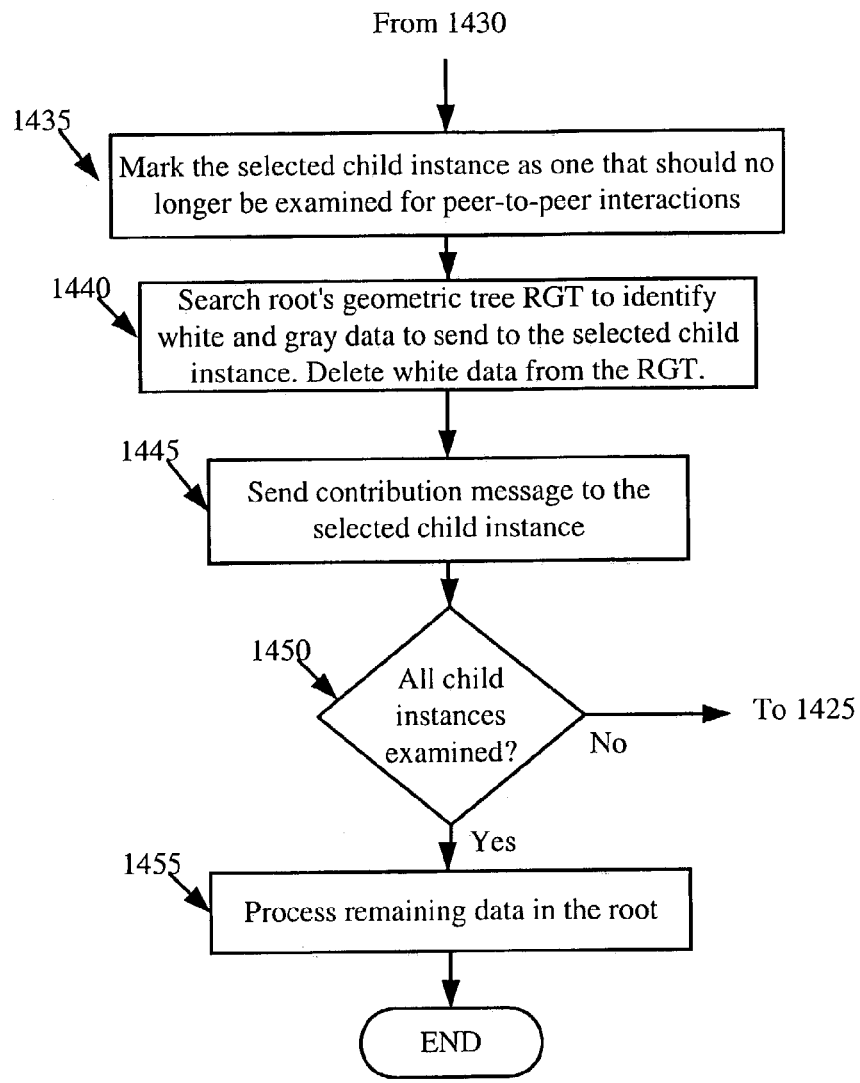
Figure 15:
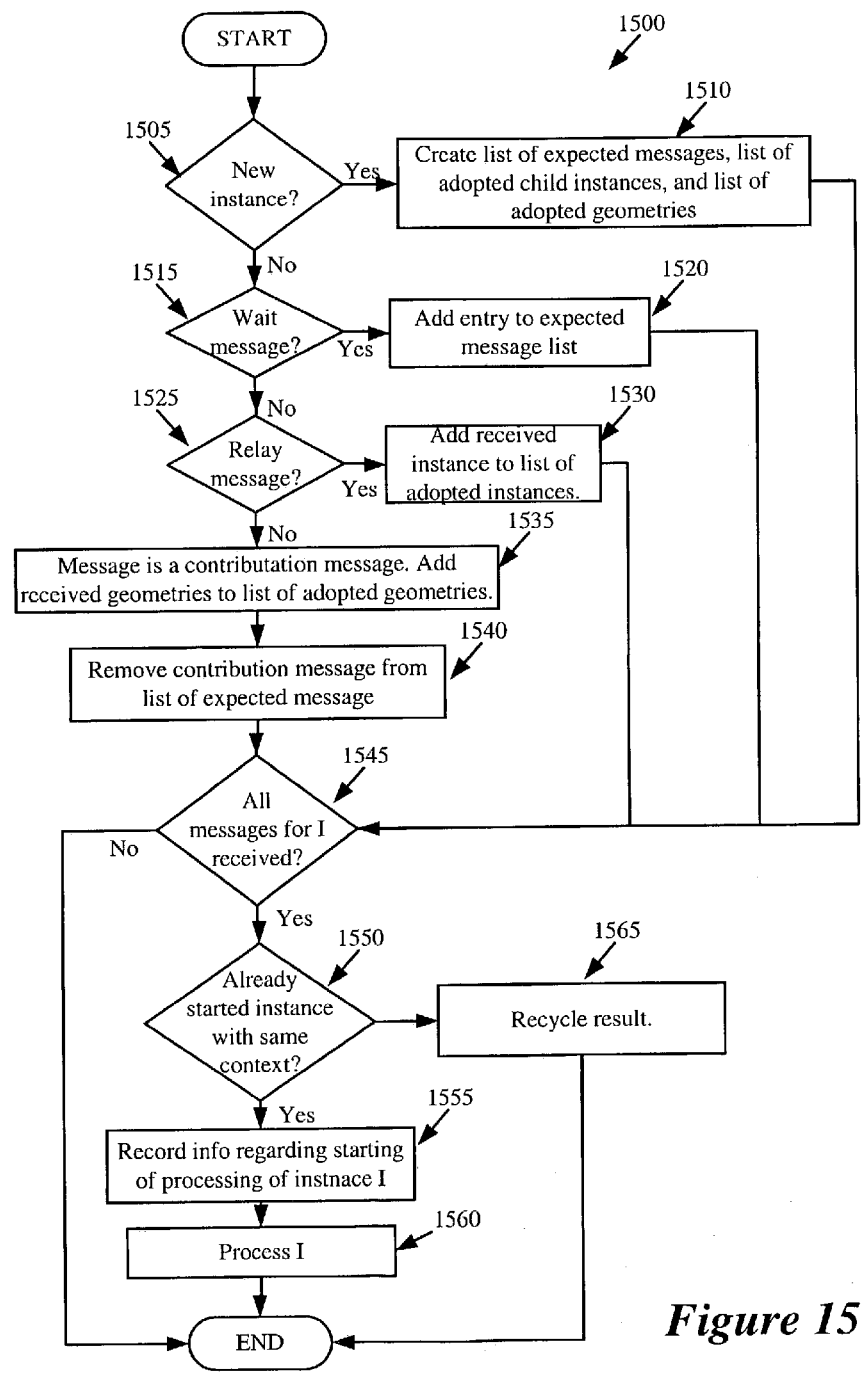
FIG. 15 illustrates the message handling process for one cell.
Figure 16A:
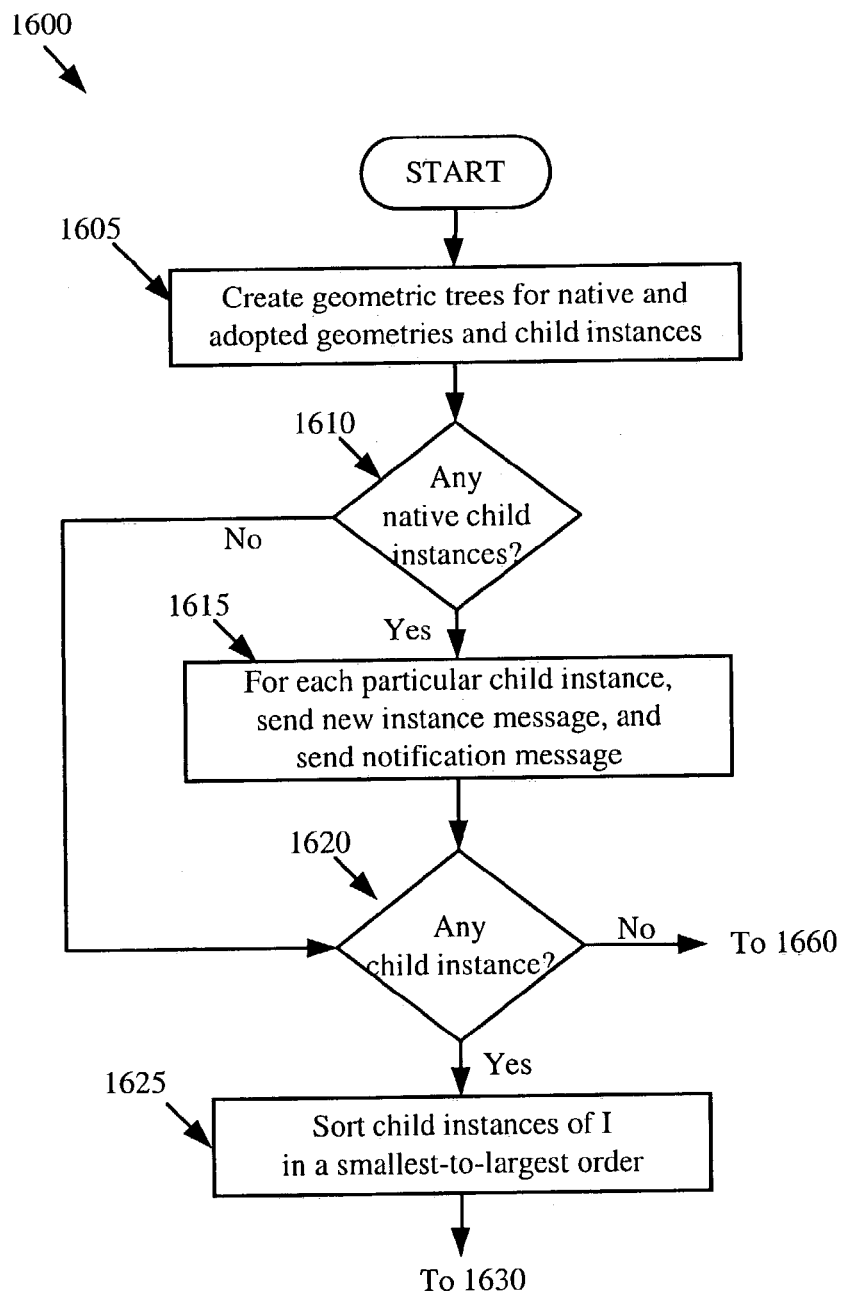
FIG. 16 illustrates how some embodiments process a particular, non-root instance after the corresponding message handling process of the particular instance has received all the messages for the particular instance.
Figure 16B:
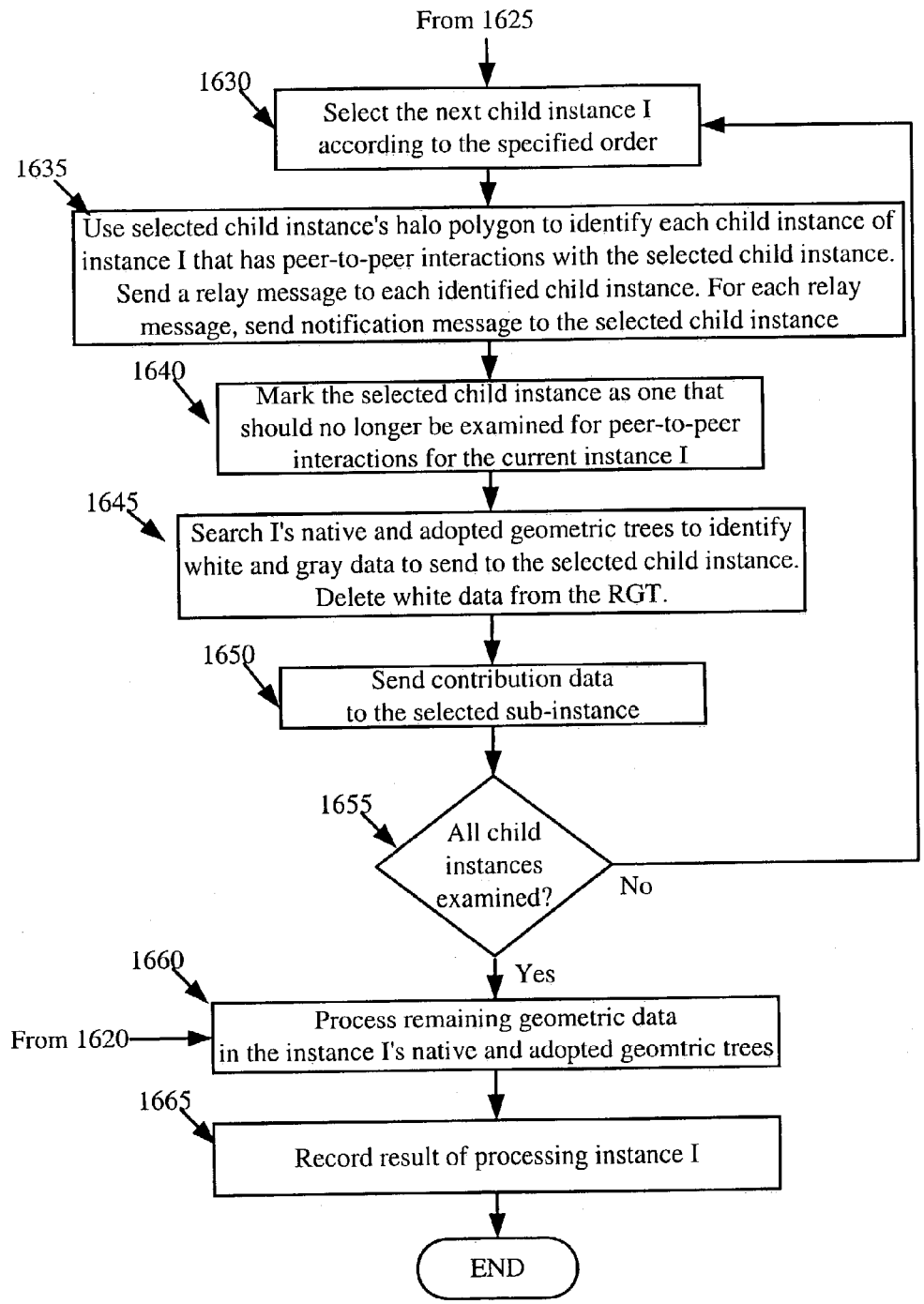

Some embodiments process the hierarchical data structure 1300 in a top-down manner by performing the processes illustrated in FIGS. 14, 15, and 16. FIG. 14 illustrates a process 1400 that starts the processing of hierarchical data structure by (1) initializing a message handling process for each cell that has at least one instance in the hierarchical data structure, and (2) processing the root node of the hierarchical data structure. FIG. 15 illustrates the message handling process 1500 for one cell. As described below, a particular cell's message handling process gathers all the messages that are sent to the instances of the particular cell, and starts the processing of a particular instance of the particular cell when it has received all the messages for the particular instance. FIG. 16 illustrates how some embodiments process a particular, non-root instance after the corresponding message handling process of the particular instance has received all the messages for the particular instance.

A. Processing the Root Instance

FIG. 14 illustrates a process 1400 that some embodiments perform for the root instance of the hierarchical instance data structure. As shown in this figure, the process 1400 starts by initializing (at 1405) the message handler of each cell that has at least one instance in the hierarchical data structure (i.e., in the design layout). Each of these cells can be identified in a list when the design is defined. The message handler of a cell will be further described below by reference to FIG. 15.

After 1405, the process 1400 specifies (at 1410) two geometric trees, a root geometry tree and a root instance tree. At 1410, the process then stores the root instance's geometries in the root geometry tree ("RGT"), and stores the root instance's child instances in the root instance tree ("RIT"). The process 1400 defines different types of geometric trees in different embodiments. Examples of geometric trees that the process can use include conventional quad-trees, conventional k-d trees, or newer k-d trees, such as those described in U.S. patent application Ser. Nos. 09/526,266 and 10/066,387, which are incorporated herein. The process 1400 uses the geometry and instance trees RGT and RIT because it can quickly perform region searches on such trees to identify peer-to-peer interactions and contribution data, as further described below.

Next, at 1415, the process sends a new-instance message to each particular child instance of the root instance. To each particular child instance, the process also sends (at 1415) a notification message to expect a contribution message from the root. As mentioned above, the message-handling process 1500 of each a particular instance's cell gathers and processes all the messages that are sent to the particular instance.

At 1420, the process 1400 then assesses the complexity of the child instances of the root instance and sorts the child instances in a least-to-most order of complexity. Some embodiments measure the complexity of the child instances only in terms of their sizes. Hence, in these embodiments, the order specified at 1420 is a smallest-to-largest order. Other embodiments, however, consider other factors instead of, or in addition to, the sizes of the child instances. These other factors include the number of instances and geometries in each child instance and in each child instance's halo.

From 1420, the process transitions to 1425. As further described below, the process typically iterates several times through 1425. At each iteration through 1425, the process selects a child instance S that is highest on the order specified at 1420 and that has not been selected by the process 1400 in any previous iteration through 1425. In the first pass through 1425, the process selects the instance that is first on the specified order (i.e., selects the child instance that is the least complex).

The process then identifies (at 1430) the set of the root's child instances that have peer-to-peer interactions with the selected child instance (i.e., the child instance selected at 1425). To identify the set of child instances at 1430, the process uses the selected child instance's halo polygon to search the root instance tree ("RIT"). Specifically, the process adds (at 1430) to the set of identified child instances any child instance stored in the RIT that falls within the selected child instance's halo and that the process 1400 has not marked (at 1435, as described below) as one that should not be examined for peer-to-peer interactions.

To each particular child instance P identified at 1430, the process sends (at 1430) a relay message that directs the particular child instance P to adopt the selected child instance S (i.e., sends message R→P→S: P adopt S). As further described below, the process 1600 for the particular child instance P will examine the selected child instance S while processing the particular child instance P for peer-to-peer interactions of the child instances of the particular child instance P and for data contribution from the particular child instance P to the selected child instance S.

For each relay message that the process 1400 sends (at 1430) to a particular child instance P, the process 1400 also sends (at 1415) a notification message to the selected child instance S to expect a message from the particular instance P (i.e., sends message R→S←P: S wait for data from P). The process then marks (at 1435) the selected child instance S as one that it should no longer examine for peer-to-peer interactions (i.e., for interactions with other child instances of the root instance).

Next, at 1440, the process identifies a set of the geometries GeomBundle (i.e., a set of the geometries) in the root instance that needs to be pushed into the selected child instance S. To identify such a set of geometries GeomBundle, the process uses the selected child instance's halo polygon to search the root geometry tree ("RGT"). Specifically, the process adds (at 1430) to the set of identified geometries GeomBundle any portion of a geometry that is stored in the RGT and that falls within the selected child instance's halo. In the identified set of geometries Geom- Bundle, the process marks the portions that fall into the selected child instance's core as white data, and marks the portions that fall into the selected child instance's halo but not its core as gray data. The process also deletes (at 1440) from the RGT all the white data that it added to the identified set of geometries GeomBundle.

After 1440, the process sends (at 1445) a contribution message to the selected child instance S that forwards the set of geometries identified at 1440 (i.e., sends message R→S: GeomBundle). The process then determines (at 1450) whether it has examined all the child instances of the root. If not, the process transitions back to 1425 to select the next child instance on the order specified at 1420, and then repeats the operations 1430–1450 for the newly selected child instance.

When the process determines (at 1450) that it has examined the last child instances on the specified order, it calls (at 1455) another process to deal with the processing of the remaining data in the root's data set. This remaining data includes any geometry that the process 1400 did not push into the root's child instances of the root. It also might include boundary and/or location information about the child instances of the root, but typically does not include any information about the content of these child instances. Processing data that remains in an instance after the instance has sent its relay and contributions message is further described below. After 1455, the process ends.

B. Message-Handling Process

A particular cell's message handling process gathers all the messages that are sent to the instances of the particular cell. So, in the example illustrated in FIG. 12, all messages that are intended for instances B1, B2, B3, or B4 would be sent to the message-handling process of cell B. After gathering all the messages that are sent for a particular instance of the particular cell, the message-gathering process of the particular cell starts the processing of the particular instance of the particular cell.

FIG. 15 illustrates a message handling process 1500 that the message handler of an arbitrary cell X performs when it receives a message that is addressed to one of the instances of cell X. The messages that the process 1500 might receive include a new-instance message, a contribution message, a notification message, and a relay message. The instance for which the message is received at 1505 is referred to as instance I in the remaining discussion of the process 1500.

After receiving the message for the instance I, the process 1500 initially determines (at 1505) whether the message is a new-instance message. As mentioned above, a new-instance message informs the cell that a new instance I of the cell X has been encountered while another instance was being processed. When the process 1500 determines (at 1505) that the received message identifies a new instance I of the cell X, the process initializes (at 1510) several lists for the new instance I. These lists include a list of expected messages for the new instance I, a list of adopted child instances of the new instance I, and a list of adopted geometries of the new instance I. These lists are initialized as empty lists. These lists supplement two other lists that are specified for each instance (including instance I) of the cell X. These two are lists are the list of native child instances and the list of native geometries. After 1510, the process transitions to 1545, which will be further described below.

If the process determines (at 1505) that the received message is not a new-instance message, the process then determines (at 1515) whether the new message is a notification message. As mentioned above, a notification message is sent to a child instance I, after a new-instance message is generated and sent for the child instance I. This notification message tells the child instance I to expect a contribution message from its parent. As further described above, a notification message is also sent to a particular instance I, after a first instance tells a second instance to adopt the particular instance I. This notification message tells the particular instance I to expect a contribution message from the second instance. When the new message is a notification message, the process 1500 records (at 1520) the received message in the list of expected message of the instance I. From 1520, the process then transitions to 1545, which is will be described below.

If the process 1500 determines (at 1515) that the received message is not a notification message, it then determines (at 1525) whether the received message is a relay message that directs the instance I to adopt another instance S. If so, the process (at 1530) adds the instance S to the instance I's list of adopted child instances, and then transitions to 1545.

If the process determines (at 1525) that the received message is not a relay message, the received message must be a contribution message from an actual parent or an adopted parent instance. Hence, the process adds (at 1535) the geometries forwarded by the contribution message to the list of adopted geometries of the instance I. In adding these geometries, the process maintains the markings of the geometries as white and gray data. The process then removes (at 1540) the contribution message from the list of expect messages of the instance I, and then transitions to 1545.

At 1545, the process determines whether it has received all the messages for the instance I (i.e., whether the list of expected messages of instance I is empty). If not, the process ends. Otherwise, the process determines (at 1550) whether it has previously started the processing of another instance I' of cell X with the same exact context as instance I. Different embodiments make this determination differently. For instance, as mentioned above, some embodiments compute a hash value from the messages that they receive for an instance I'. These embodiments then store the computed hash value in a hash table. Accordingly, in these embodiments, the process 1500 makes the determination (at 1550) by computing a hash value from the messages that it received for the instance I, and determining whether the computed hash value has already been stored in the hash table.

When the process 1500 determines (at 1550) that the instance I is the first instance of cell X that is being processed with the particular context of the instance I, the process 1500 records (at 1555) indicia that identifies the context of the instance I. So, for the hashing embodiments described above, when the process 1500 discovers (at 1550) that the hash table does not store any hash value that matches the computed hash value for the instance I, it computes (at 1555) a hash value for the instance I based on the messages that it received for the instance I and records this hash value in the hash table. The process also stores in the hash table a marker that specifies that the instance I is currently being processed. After 1555, the process 1500 calls (at 1560) the process 16000 of FIG. 16 to begin the processing of the instance I. Some embodiments start a unique process 1600 to process each instance when all the messages have been received for the instance. Some of the embodiments that use the above-mentioned hash-table approach modify the value of the previously specified marker in the hash table to indicate the completion of the processing of instance I. They also set a reference to the results of the processing of the instance I. After calling the process 1600, the process 1500 ends.

On the other hand, when the process 1500 determines (at 1550) that it has previously started processing another instance I' of cell X with the same exact context as instance I (e.g., discovers at 1550 that the computed hash value has previously been stored), the process transitions to 1565. At 1565, the process (1) uses the results of the processing of the previously started instance I' for the instance I when the processing of the instance I' has been completed, or alternatively (2) waits until the previously started processing finishes and then reports the results of this processing for the instance I when the processing of the instance I' has not yet been completed. In some embodiments, the process 1500 determines whether the processing of the previously started instance I' has completed by checking whether the marker that specifies the state of the processing of the instance I' has changed to a "completed" state. After 1565, the process ends.

C. Processing Non-Root Instances

FIG. 16 illustrates a process 1600 that some embodiments perform for an instance I after the message handler for this instance's cell X receives all the messages that were directed to the instance I. As shown in this figure, the process 1600 starts by specifying (at 1605) four geometric trees, which are a native geometry tree ("NGT"), an adopted geometry tree ("AGT"), a native instance tree ("NIT"), and an adopted instance tree ("AIT"). Before 1605, the instance I's native geometries and native child instances are specified in the native geometry list and native child-instances list of this instance's cell X, while the instance I's adopted geometries and adopted child instances are stored in this instance's adopted geometry list and adopted child-instances list. At 1605, the process stores the instance I's native geometries in its NGT, adopted geometries in its AGT, native child instances in its NIT, and adopted child instances in its AIT. The process 1600 defines different types of geometric trees in different embodiments. Examples of geometric trees that the process can use include conventional quad-trees, conventional k-d trees, or newer k-d trees, such as those described in the above-mentioned patent applications. The process 1600 uses the geometry and instance trees NGT, AGT, NIT and AIT because it can quickly perform region searches on such trees to identify peer-to-peer interactions and contribution data, as further described below.

An instance might receive duplicate adoption geometry or instance data from multiple different instances. Hence, while the process 1600 is inserting (at 1605) data into the adopted geometry tree and adopted instance tree AGT and AIT to build these trees, it checks whether the data has already been entered into these trees, and if so, discards the duplicate data.

Next, at 1610, the process determines whether the instance I has any native child instance (i.e., any non-adopted child instance) by examining the native child-instance list. If not, the process transitions to 1620, which is described below. Otherwise, the process sends (at 1615) a new-instance message to each particular native child instance of the instance I. To each particular child instance, the process also sends (at 1610) a notification message to expect a contribution message from the instance I. From 1615, the process transitions to 1620.

At 1620, the process determines whether the instance I has any native or adopted child instances by examining the native and adopted child-instance lists. If not, the process transitions to 1660, which is further described below. Otherwise, at 1625, the process assesses the complexity of the native and adopted child instances of the instance I, and sorts these native and adopted child instance in a least-to-most order of complexity. Some embodiments measure the complexity of the child instances only in terms of their sizes. Hence, in these embodiments, the order specified at 1625 is a smallest-to-largest order. Other embodiments, however, consider other factors instead of, or in addition to, the sizes of the child instances. These other factors include the number of instances and geometries in each child instance and in each child instance's halo.

From 1625, the process transitions to 1630. As further described below, the process typically iterates several times through 1630. At each iteration through 1630, the process selects a child instance S that is highest on the order specified at 1625 and that has not been selected by the process 1600 in any previous iteration through 1630. In the first pass through 1630, the process selects the child instance S that is first on the specified order (i.e., selects the child instance that is the least complex).

The process then identifies (at 1635) the set of the child instances of the instance I that have peer-to-peer interactions with the selected child instance S (i.e., the child instance selected at 1630). To identify the set of child instances at 1635, the process uses the selected child instance's halo polygon to search the native instance tree NIT and possible the adopted instance tree AIT of the instance I. Specifically with one exception, the process adds (at 1635) to the set of identified child instances any child instance stored in the NIT and AIT (1) that falls within the selected child instance's halo and (2) that the process 1600 has not marked (at 1640, as described below) as a child instance that should not be examined for peer-to-peer interactions. The one exception is that when the selected child instance S is an adopted child instance, the process does not search the adopted child-instance tree AIT. This is because the process 1600 does not try to identify peer-to-peer interactions between adopted child instances.

To each particular child instance P identified at 1635, the process sends (at 1635) a relay message that directs the particular child instance P to adopt the selected child instance S (i.e., sends message I→P→S: P adopt S). As further described below, the process 1600 for the particular child instance P will examine the selected child instance S while processing the particular child instance P for peer-to-peer interactions of the child instances of the particular child instance P and for data contribution from the particular child instance P to the selected child instance S.

For each relay message that the process 1600 sends (at 1635) to a particular child instance P, the process 1600 also sends (at 1605) a notification message to the selected child instance S to expect a message from the particular instance P (i.e., sends message I→S←P: S wait for data from P). The process then marks (at 1640) the selected child instance S as one that it should no longer examine for peer-to-peer interactions (i.e., for interactions with other child instances of the instance I).

Next, at 1645, the process identifies a set of the geometries GeomBundle (i.e., a set of the geometries) in the instance I that needs to be pushed into the selected child instance S. To identify such a set of geometries GeomBundle, the process uses the selected child instance's halo polygon to search the native and adopted geometry trees NGT and AGT of the instance I. Specifically, the process adds (at 1645) to the set of identified geometries GeomBundle any portion of a geometry that is stored in the NGT or AGT and that falls within the selected child instance's halo. In the identified set of geometries GeomBundle, the process marks the portions that fall into the selected child instance's core as white data, and marks the portions that fall into the selected child instance's halo but not its core as gray data. The process also deletes (at 1630) from the NGT and AGT all the white data that it added to the identified set of geometries GeomBundle.

After 1645, the process sends (at 1650) a contribution message to the selected child instance S that forwards the set of geometries identified at 1645 (i.e., sends message I→S: GeomBundle). The process then determines (at 1655) whether it has examined all the child instances of the instance I. If not, the process transitions back to 1630 to select the next child instance on the order specified at 1625, and then repeats the operations 1635–1655 for the newly selected child instance. When the process determines (at 1655) that it has examined the last child instances on the specified order, it transitions to 1660.

At 1660, the process 1600 calls another process to deal with the processing of the remaining data in the native and adopted geometry trees NGT and AGT of the instance I. This remaining data includes any geometry that the process 1600 did not push into the child instances of the instance I. It also might include boundary and/or location information about the child instances of the root, but typically does not include any information about the content of these child instances. Processing data that remains in an instance after the instance has sent its relay and contributions message is further described below. After 1455, the process ends.

After 1660, the process records the results of processing the instance I, so that later processed instances of the cell X that have the same context of the instance I can re-use this processed data. In some embodiments, this recording not only entails storing the results of the processing of instance I, but also entails modifying the value of a marker stored in a hash table to indicate the completion of the processing of instance I, and the setting of a reference to the results of the processing of the instance I. After 1665, the process ends.

D. Local Processing

The invention can be used in a variety of different applications. Hence, different embodiments can perform very different local processing on the data that remains within a particular instance I after pushing down all possible data of the particular instance I (i.e., after sending out all possible contribution messages from the particular instance).

Below is the pseudo code for one local processing operation that can be performed.

Function LocalProcessing(trees):
foreach wire W in the native and adopted trees
  ensure W will never be found by a search of these trees again
  search the native and adopted geometry trees, region=W.spacing
  foreach other wire O found on the same layer as W,
    if W.is White or O.is White
      if !touching (W, O)
        ReportError(SPACING, W, O)//wires are too close
      else if W.net ?=O.net
        ReportError(SHORT, W, O)//touching but not the same net: a short
      // else touching the same net: no check appropriate
    else // do noting, skip gray-gray interactions
End.

This process checks the spacing between each pair of white wires and each pair of white and gray wires, and generates an error when the spacing between each checked pair is not more than a particular value. This process also verifies that when a white wire touches another white or gray wire, both touching wires are from the same net. If not, the process generates an error. This process does not check the spacing or contact between any pair of wires that are gray data for the instance I.

Below is the pseudo code for another local processing operation that can be performed.

Function LocalProcessingForCExtraction(trees):
foreach wire W in native and adopted trees,
  Search the neighborhood of the wire W
  Foreach other wire O found (not including W itself)
    If W.is White or O.is White
      Use an extraction model to compute capacitance value
      Add computed value to aggregate capacitance value for W
End.

This process computes the capacitance between each pair of white wires and each pair of white and gray wires, and maintains an aggregate capacitance value for each wire. The pseudo code above is simply to illustrate the concept of using the invention for performing extraction. Typical capacitance extraction processes are slightly different than the process depicted by the above pseudo code. Specifically, capacitance extraction processes typically do not compute capacitance values through pairwise analysis of wires. Instead, for instance, they perform profile decomposition or profile reductions that account for the set of native and adopted data and account for the white and gray markings of the adopted data.

IV. Example

Figure 17:
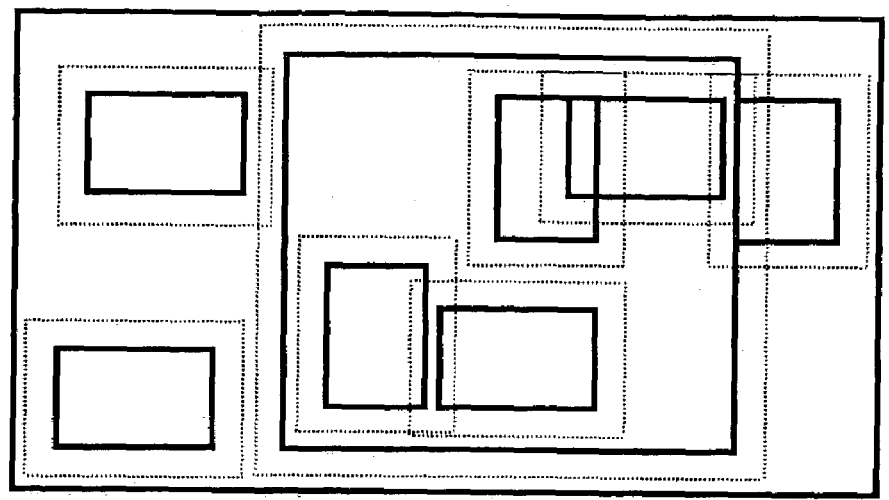
FIGS. 17–24 illustrate the processing of the instances illustrated in the example of FIGS. 11–13.

To illustrate the operation of the processes 1400, 1500, and 1600 of FIGS. 14–16, the processing of the IC design 1200 of FIG. 12 will now be further described. FIG. 17 illustrates the design 1200 with halos about all the non-root instances. The halos are drawn to illustrate the interactions between the instances in this design. All these interactions will have to be considered to accurately process the design 1200.

A. Processing of the Root Instance

The processing of the design 1200 starts by the first starting the process 1400 to process the root instance 1305 of the hierarchical data structure 1300 illustrated in FIG. 13. The process 1400 then initializes (at 1405) the message handlers of each cell that has an instance in the design other than the root instance. Next, the process 1400 defines (at 1410) the geometric trees RGT and RIT for the root instance 1305.

The process 1400 then sends (at 1415) a new-instance message and its corresponding notification message to each of the five child instances A3, B2, B3, B4, and E1 of the root instance 1305. The message handler of each instance's cell receives the two messages sent to the instance, and performs the operations 1510 and 1520 illustrated in FIG. 15.

The process 1400 then sorts (at 1420) the child instances A3, B2, B3, B4, and E1 according to an ascending order of complexity. In this example, it is assumed that the specified order is B3, B2, B4, A3 and E1. In this example, it is also assumed that no two instances of the same cell have the same context.

The process then performs 1425–1450 several times to identify peer-to-peer interactions between these child instances and to send contribution messages to each of these child instances. The root instance 1305 only knows of its five child instances in the design 1200. Hence, the process 1400 cannot identify all of the peer-to-peer interactions illustrated in FIG. 17, but can only identify the interactions presented in FIG. 18, which illustrates the problem from the root's viewpoint. Similarly, the process 1400 cannot directly send a contribution message to a child instance of one of the root's child instances. So, when a geometry (e.g., a wire) in the root overlaps a child of a particular child instance of the root, the process 1400 will have to rely on the process 1600 of the particular child instance to send the contribution message that forwards relevant portions of the geometry (e.g., relevant segments of the wire) to its child.

The operations 1425–1450 of the process 1400 will now be described for each of the root's child instances. As mentioned above, it is assumed that the order for this processing is: B3, B2, B4, A3 and E1.

1. Examining B3 for Peer-to-Peer Interactions and Contribution Messages

Figure 18:
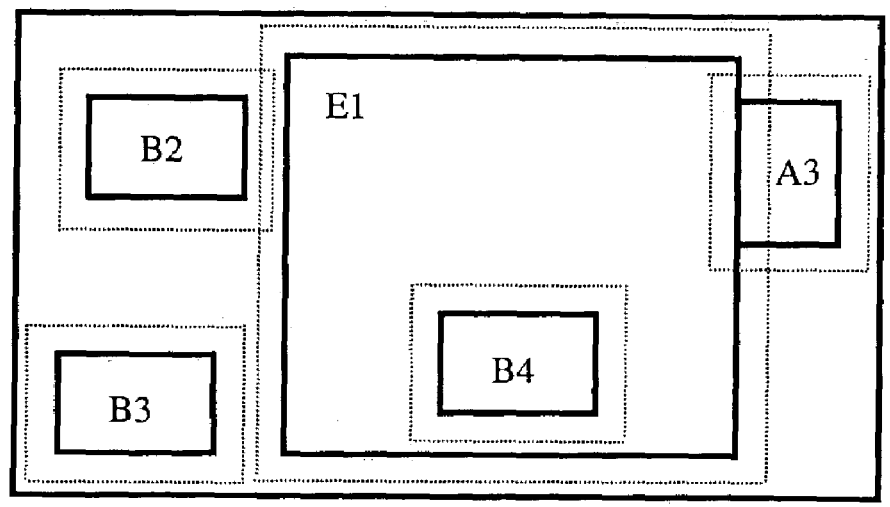

The process 1400 first selects the instance B3 at 1425. As shown in FIG. 18, the instance B3 does not interact with any other children of the root. Hence, at 1430, the process 1400 cannot identify any peer-to-peer interactions and does not send any relay or notification message. It then marks (at 1435) the instance B3 as an instance that it should no longer examine for peer-to-peer interactions while processing the root.

Figure 19:
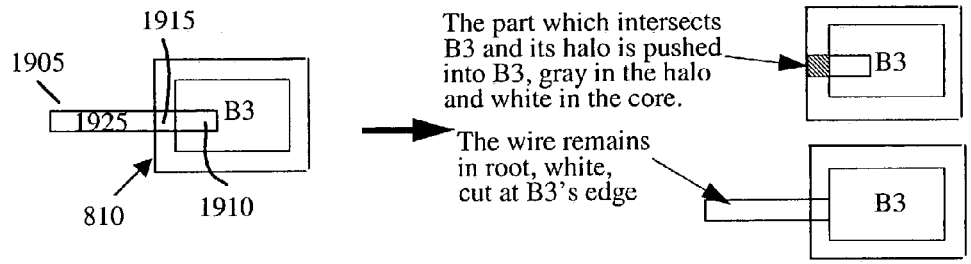

The process then uses (at 1440) the halo polygon of the instance B3 to search the RGT of the root instance to identify the geometries that it should push from the root instance into the instance B3. FIG. 19 presents an example that illustrates pushing data into the instance B3 from the root 1305. In this example, a wire 1905 within the root instance overlaps with the instance B3. A first portion 1910 of this wire falls within the instance B3, a second portion 1915 of the wire falls within the halo 1920 of the instance B3, and a third portion 1925 of the wire is outside of the instance and its halo. The wire's first portion 1910 is white data for the instance B3, while its second portion 1915 is gray data for the instance B3. The process 1400 deletes (at 1440) the segment 1910 from the root's RGT. The process 1400 also sends to the instance B3 the wire segments 1910 and 1915 with the following message:

root→instance B3: gray portion 1915 and white portion 1910.

The process 1400 then determines (at 1450) that it has not yet examined all the child instances of the root. Hence, it returns to 1425.

2. Examining B2 for Peer-to-Peer Interactions and Contribution Messages

When the process 1400 returns to 1425, it selects the instance B2 as it is the next instance on the specified order. Next, at 1430, the process 1400 examines the other unmarked, root child instance (which in this case are E1, B4, and A3), in order to identify peer-to-peer interactions with the instance B2. As shown in FIG. 18, the instance B2 does not interact with any other children of the root. Only the halos of the instances B2 and E1 overlap, and such an overlap does not specify a potential interaction between the data within instance E1 and the data within the instance B2. Hence, at 1430, the process 1400 sends no relay or contribution message. The process then marks (at 1435) the instance B2 as an instance that it should no longer examine for peer-to-peer interactions while processing the root.

Figure 20:
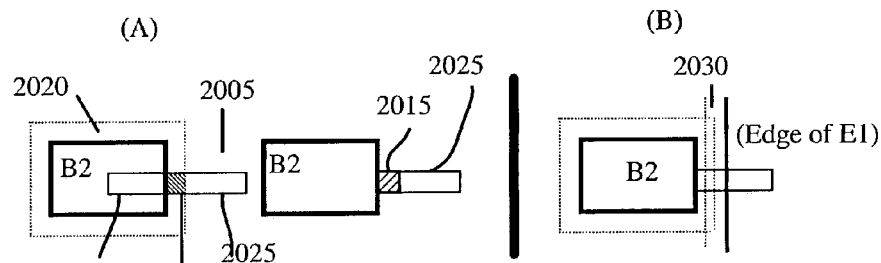

The process then uses (at 1440) the halo polygon of the instance B2 to search the RGT of the root instance to identify the geometries that it should push from the root instance into the instance B2. FIG. 20 presents an example that illustrates pushing data into the instance B2. In this example, a wire 2005 within the root instance overlaps with the instances B2 and E1. A first portion 2010 of this wire falls within the instance B2, a second portion 2015 of the wire falls within the halo 2020 of the instance B2, and a third portion 2025 of the wire is outside of the instance B2 and its halo. As shown in part (A) of FIG. 20, the wire's first portion 2010 is white data for the instance B2, while its second portion 2015 is gray data for the instance B2. Hence, the process 1400 deletes (at 1440) the portion 2010 from the root's RGT, and then forwards (at 1445) to the instance B2 the portions 2010 and 2015 with the following message:

root→instance B2: gray portion 2015 and white portion 2010.

Part (B) of FIG. 20 illustrates that the wire's second and third portions 2015 and 2025 are left in the root after the processing of the instance B2. This is the case even though, as shown in part (C) of FIG. 20, the second portion partially falls in the halo 2030 of the instance E1 and the third portion 2025 falls partially in this halo and partially in the instance E1. After the process 1400 processes the instance B2 for the root, the wire's second and third portions 2015 and 2025 are left in the root and are not assigned to the instance E1, because the process 1400 has not yet encountered the instance E1.

After 1445, the process 1400 determines (at 1450) that it has not yet examined all the child instances of the root. Hence, it returns to 1425.

3. Examining B4 for Peer-to-Peer Interactions and Contribution Messages

When the process 1400 returns to 1425, it selects the instance B4 as it is the next instance on the specified order. Next, at 1430, the process 1400 examines the other unmarked, root child instance (which in this case are E1 and A3), in order to identify peer-to-peer interactions with the instance B4. As shown in FIG. 18, the data within instance E1 might interact with the data within the instance B4 as the halo of the instance B4 overlaps the instance E1. Hence, at 1430, the process 1400 sends a relay message to E1 to adopt B4 as an adopted child instance and sends a notification message to B4 to expect a message from E1. These two messages are as follows:

root→instance E1←instance B4: E1 adopt B4.
root→instance B4←instance E1: B4 wait for data from E1.

Figure 21:
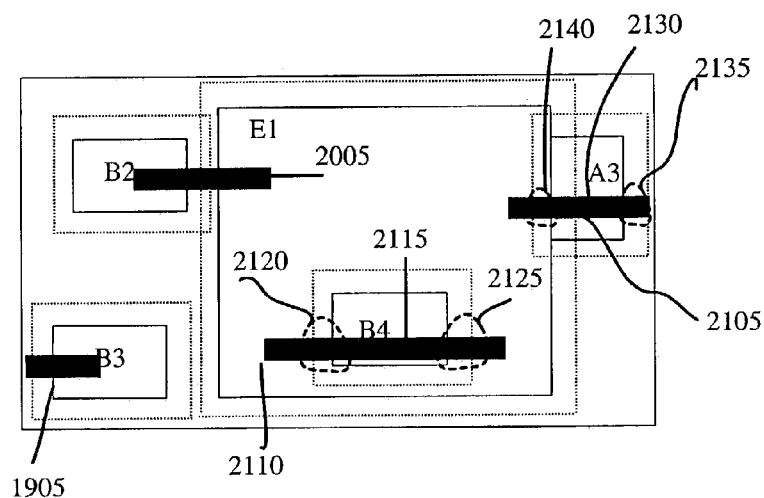

The process then marks (at 1435) the instance B4, as an instance that it should no longer examine for peer-to-peer interactions while processing the root. The process next uses (at 1440) the halo polygon of the instance B4 to search the RGT of the root instance to identify the geometries that it should push from the root instance into the instance B4. FIG. 21 presents an example that illustrates pushing data into the instance B4. In this example, a wire 2110 within the root instance overlaps with the instances B4 and E1. This figure also illustrates the wires 1905 and 2005, which overlap instance B3 and B2 as described above, and a root wire 2105 that overlaps the instance A1 and E1. FIG. 21 illustrates the wires 1905 and 2005 before they were trimmed (in previous iterations of 1440) to push white data into the instances B3 and B2.

As shown in FIG. 21, a first portion 2115 of the wire 2110 falls within the instance B4, while two portions 2120 and 2125 of the wire 2110 fall within the halo of the instance B4. The remaining portions of the wire 2110 fall within the instance E1, which is not currently being analyzed.

After using the halo polygon of the instance B4 to identify the portion 2115 of the wire 2110, the process 1400 deletes (at 1440) the portion 2115 from the root's RGT. It then forwards (at 1445) to the instance B4 the portions 2115, 21.20, and 2125 with the following message:

root→instance B4: gray portion 2120 and 2125 and white portion 2115.

After 1445, the process 1400 determines (at 1450) that it has not yet examined all the child instances of the root. Hence, it returns to 1425.

4. Examining A3 for Peer-to-Peer Interactions and Contribution Messages

When the process 1400 returns to 1425, it selects the instance A3 as it is the next instance on the specified order. Next, at 1430, the process 1400 examines the other unmarked, root child instance (which in this case is only E1), in order to identify peer-to-peer interactions with the instance A3. As shown in FIG. 18, the data within instance E1 might interact with the data within the instance A3 as the halo of the instance A3 overlaps the instance E1. Hence, at 1430, the process 1400 sends a relay message to E1 to adopt A3 as an adopted child instance and sends a notification message to A3 to expect a message from E1. These two messages are as follows:

root→instance E1→instance A3: E1 adopt A3.

root→instance A3←instance E1: A3 wait for data from E1.

The process then marks (at 1435) the instance A3 as an instance that it should no longer examine for peer-to-peer interactions while processing the root. The process next uses (at 1440) the halo polygon of the instance A3 to search the RGT of the root instance to identify the geometries that it should push from the root instance into the instance A3. In the example illustrated in FIG. 21, a wire 2105 within the root instance overlaps with the instances A3 and E1. As shown in this figure, a first portion 2130 of the wire 2105 falls within the instance A3, while two portions 2135 and 2140 of the wire 2105 fall within the halo of the instance A3. The remaining portions of the wire 2105 fall within the instance E1, which is not currently being analyzed. After using the halo polygon of the instance A3 to identify the portion 2130 of the wire 2105, the process 1400 deletes (at 1440) the portion 2130 from the root's RGT. It then forwards (at 1445) to the instance A3 the portions 2130, 2135, and 2140 with the following message:

root→instance A3: gray portion 2135 and 2140 and white portion 2130.

After 1445, the process 1400 determines (at 1450) that it has not yet examined all the child instances of the root. Hence, it returns to 1425.

5. Examining E1 for Peer-to-Peer Interactions and Contribution Messages

When the process 1400 returns to 1425, it selects the instance E1 as it is the next instance on the specified order. Next, at 1430, the process 1400 determines that there is no unmarked, root child instance that it should examine for peer-to-peer interactions with the instance E1. Hence, at 1430, the process 1400 does not send any relay or notification message.

Figure 22:
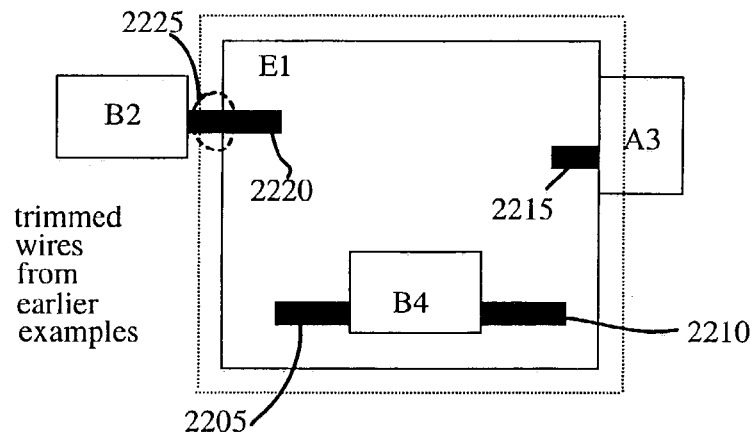

The process then marks (at 1435) the instance E1 as an instance that it should no longer examine for peer-to-peer interactions while processing the root. The process next uses (at 1440) the halo polygon of the instance E1 to search the RGT of the root instance to identify the geometries that it should push from the root instance into the instance E1. FIG. 22 illustrates the example presented in FIG. 21, after the trimming of the wires of the root instance in the previous iterations of the process 1400 through 1440. FIG. 22 also illustrates the ghost images of the instances B2, B4, and A3, even though the process 1400 does not examine these instances while processing of the instance E1.

The process then uses (at 1440) the halo polygon of the instance E1 to search the RGT of the root instance to identify the geometries that it should push from the root instance into the instance E1. In the example illustrated in FIG. 22, the process identifies the following white data segments: segments 2205 and 2210 of the wire 2110, segment 2215 of the wire 2105, and the segment 2220 of the wire 1905. The process also identifies segment 2225 of the wire 1905 as gray data for the instance E1. The process deletes (at 1440) all the identified white segments from the root's RGT. It then forwards (at 1445) to the instance E1 the segments 2205, 2210, 2215, 2220, and 2225 with the following message:

root→instance E1: gray portion 2225 and white portion 2205, 2210, 2215, and 2220.

6. Local Processing of Root

After performing 1445 for the instance E1, the process 1400 determines (at 1450) that it has examined all the child instances of the root. Hence, it transitions to 1455, where it calls a process for processing the remaining data in the root instance. One example of such processing was described above.

B. Processing of the Child Instances of the Root

The messages that are sent by the root instance and the other instances are handled by three message handlers, a handler for cell A, a handler for cell B, and a handler for cell C. Each message handler performs the process 1500 of FIG. 15 each time it receives a message. When a message handler of cell A, B, or E determines (at 1545) that all messages have been received for a particular instance of its cell, it will start the process 1600 to analyze the content of the particular instance.

The processes 1600 for the instances B2, B3, B4, and A3 is relatively uneventful as these instances do not have any child instances, and therefore do not require the sending of relay, notification, and contribution messages. Hence, these processes expeditiously reach operation 1660 to process the data within their respective instance B2, B3, B4, or A3. It should be noted that the processing of B4 and A3 cannot start until the instance E1 sends a contribution message to each of these instances. In addition, once E1 is processed, the instance A3 is adopted by instance B2, and hence is informed that it also needs to receive a contribution message from B2.

Figure 23:
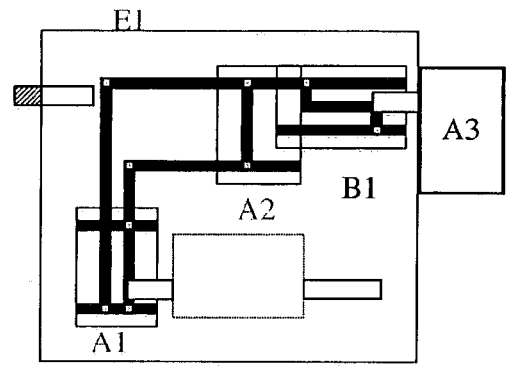

The process 1600 for the instance E1, however, is more interesting as this instance has three native child instances, which are A1, A2, and B1, and two adopted child instances, which are A3 and B4. This process will now be described to illustrate an example of processing a non-root instance that has child instances. FIG. 23 illustrates the set of data for the instance E1 at the start of its process 1600. In addition to its three child instances A1, A2, and B1, and the wiring between these child instances, the problem of instance E1 includes the white wire segments 2205, 2210, 2215, and 2220 and the gray wire segments 2225, which were passed to the instance E1 by the root instance. It is assumed that the ascending order of complexity for the native and adopted child instances of E1 is: A1, A2, A3, B4, and B1. Also, A1, A2, and A3 do not have the same context, nor do B1 and B4 have the same context.

Once the process 1600 starts for E1, it determines (at 1605) whether the processing of another instance of E with the same context as E1 has already started. In this case, the design does not have another instance of E. Hence, the process 1600 next records (at 1612) information regarding the start of the processing of E1, and then creates (at 1605)

geometric trees NGT, AGT, NIT, and AIT. In the NGT, the process stores the native geometries of E1. These geometries include the wire segments that connect A1, A2, and B1. In the AGT, the process stores the white wire segments 2205, 2210, 2215, and 2220 and the gray wire segments 2225. The process stores the instances A1, A2, and B1 in the NIT, and stores the instances B4 and A3 in the AIT.

Since E1 has native child instances, the process 1600 then sends (at 1615) new-instance messages and their follow-up notification messages for the instances A1, A2, and B1. The message handler of each instance's cell receives the two messages sent for the instance, and performs the operations 1510 and 1520 illustrated in FIG. 15.

Figure 24:
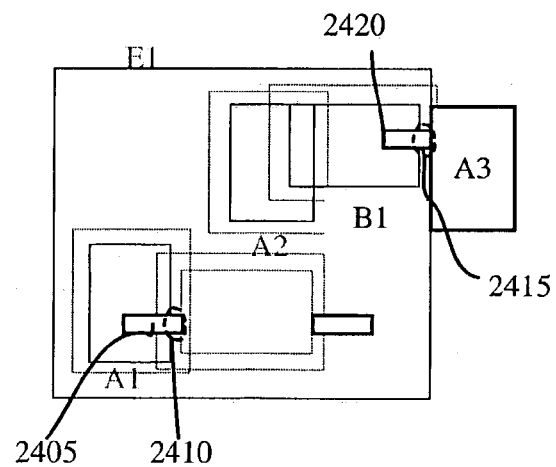

The process then sorts (at 1625) the child instances A1, A2, A3, B1 and B4 according to an ascending order of complexity. As mentioned above, it is assumed that the specified order is A1, A2, A3, B4, and B1. The process then performs 1630–1655 several times to identify peer-to-peer interactions between these child instances and to send contribution messages to each of these child instances. FIG. 24 illustrates the interaction between the child instances A1, A2, A3, B4, and B1.

The operations 1630–1655 of the process 1600 will now be described for each of the instance E1's child instances.

1. Examining A1 for Peer-to-Peer Interactions and Contribution Messages

The process 1600 first selects the instance A1 at 1630. The instance A1's halo includes a portion of the instance B4. Hence, at 1635, the process 1600 sends a relay message to B4 to adopt A1 as a child instance and sends a notification message to A1 to expect a message from B4. These two messages are as follows:

E1→instance B4→instance A1: B4 adopt A1.
E1→instance A1←instance B4: A1 wait for data from B4.

The process then marks (at 1640) the instance A1 as an instance that it should no longer examine for peer-to-peer interactions while processing E1.

The process then uses (at 1645) the halo polygon of the instance A1 to search the NGT and AGT of the instance E1 to identify the geometries that it should push from the instance E1 into the instance A1. In the set of geometries that it identifies, the process marks the ones that fall into the core of the instance A1 as white geometries and marks the ones that do not fall in the core of instance A1 but fall in its halo as gray geometries. As shown in FIG. 24, the wire segment 2205 is one of the wire segments that falls into the halo polygon of the instance A1. This wire segment was passed down from the root instance. This wire segment gets broken into two segments, 2405 and 2410. The segment 2405 is marked as white data for the instance A1, while the segment 2410 is marked as gray data for the instance A1. The process deletes (at 1645) from E1's NGT and AGT the white geometries that it identified at 1645. To the instance A1, it then sends (at 1650) the identified white and gray geometries with the following message:

E1→instance A1: gray and white geometries.

The process 1600 then determines (at 1655) that it has not yet examined all the child instances of the instance E1. Hence, it returns to 1630.

2. Examining A2 for Peer-to-Peer Interactions and Contribution Messages

When the process 1600 returns to 1630, it selects the instance A2 as it is the next instance on the specified order. Next, at 1635, the process 1600 examines the other unmarked, E1 child instance (which in this case are A3, B1 and B4), in order to identify peer-to-peer interactions with the instance A2.

The instance A2's halo includes a portion of the instance B1. Hence, at 1635, the process 1600 sends a relay message to B1 to adopt A2 as a child instance and sends a notification message to A2 to expect a message from B1. These two messages are as follows:

E1→instance B1←instance A2: B1 adopt A2.
E1→instance A2←instance B1: A2 wait for data from B1.

The process then marks (at 1640) the instance A2 as an instance that it should no longer examine for peer-to-peer interactions while processing E1.

The process then uses (at 1645) the halo polygon of the instance A2 to search the NGT and AGT of the instance E1 to identify the geometries that it should push from the instance E1 into the instance A2. In the set of geometries that it identifies, the process marks the ones that fall into the core of the instance A2 as white geometries and marks the ones that do not fall in the core of instance A2 but fall in its halo as gray geometries. The process deletes (at 1645) from E1's NGT and AGT the white geometries that it identified at 1645. To the instance A2, it then sends (at 1650) the identified white and gray geometries with the following message:

E1→instance A2: gray and white geometries.

The process 1600 then determines (at 1655) that it has not yet examined all the child instances of the instance E1. Hence, it returns to 1630.

3. Examining A3 for Peer-to-Peer Interactions and Contribution Messages

When the process 1600 returns to 1630, it selects the instance A3 as it is the next instance on the specified order. Next, at 1635, the process 1600 examines the other unmarked, E1 child instance (which in this case are B1 and B4), in order to identify peer-to-peer interactions with the instance A3.

The instance A3's halo includes a portion of the instance B1. Hence, at 1635, the process 1600 sends a relay message to B1 to adopt A3 as a child instance and sends a notification message to A3 to expect a message from B1. These two messages are as follows:

E1→instance B1←instance A3: B1 adopt A3.
E1→instance A3←instance B1: A3 wait for data from B1.

The process then marks (at 1640) the instance A3 as an instance that it should no longer examine for peer-to-peer interactions while processing E1.

The process then uses (at 1645) the halo polygon of the instance A3 to search the NGT and AGT of the instance E1 to identify the geometries that it should push from the instance E1 into the instance A3. In the set of geometries that it identifies, the process marks the ones that fall into the core of the instance A3 as white geometries and marks the ones that do not fall in the core of instance A3 but fall in its halo as gray geometries. As shown in FIG. 24, a portion of the segment 2215 falls into the halo of the instance A3. The wire segment 2215 was originally passed down from the root instance. The portion of the wire segments 2215 that falls into A3's halo will be sent to A3 as gray data. This will be the second time that this portion has been sent to A3 as gray data. The process 1400 previously sent these portions from the root instance to A3. When a process 1600 is run for the instance A3, it will delete the duplicate data at 1605 when it is creating the geometric trees for the instance A3.

The process deletes (at 1645) from E1's NGT and AGT the white geometries that it identified at 1645. To the instance A3, it then sends (at 1650) the identified white and gray geometries with the following message:

E1→instance A3: gray and white geometries.

The process 1600 then determines (at 1655) that it has not yet examined all the child instances of the instance E1. Hence, it returns to 1630.

4. Examining B1 for Peer-to-Peer Interactions and Contribution Messages

When the process 1600 returns to 1630, it selects the instance B1 as it is the next instance on the specified order. Next, at 1635, the process 1600 tries to identify peer-to-peer interactions with the instance B1 by examining the other unmarked, E1 child instance, which in this case is just B4. The instance B4 does not fall into B1's halo. Hence, at 1635, the process 1600 does not send any relay or notification message. The process marks (at 1640) the instance B1 as an instance that it should no longer examine for peer-to-peer interactions while processing E1.

The process then uses (at 1645) the halo polygon of the instance B1 to search the NGT and AGT of the instance E1 to identify the geometries that it should push from the instance E1 into the instance B1. In the set of geometries that it identifies, the process marks the ones that fall into the core of the instance B1 as white geometries and marks the ones that do not fall in the core of instance B1 but fall in its halo as gray geometries.

As shown in FIG. 24, the segment 2215 of the wire 2105 is one of the wire segments that falls into the halo polygon of the instance B1. This wire segment was passed down from the root instance. This wire segment gets broken into two segments, 2415 and 2420. The segment 2415 is marked as white data for the instance B1, while the segment 2420 is marked as gray data for the instance B1. The process deletes (at 1645) from E1's NGT and AGT the white geometries that it identified at 1645. To the instance B1, it then sends (at 1650) the identified white and gray geometries with the following message:

E1>instance B1: gray and white geometries.

The process 1600 then determines (at 1655) that it has not yet examined all the child instances of the instance E1. Hence, it returns to 1630.

5. Examining B4 for Peer-to-Peer Interactions and Contribution Messages

When the process 1600 returns to 1630, it selects the instance B4 as it is the next instance on the specified order. Next, at 1635, the process 1600 determines that there is no unmarked, root child instance that it should examine for peer-to-peer interactions with the instance E1. Hence, at 1635, the process 1600 does not send any relay or notification message. The process marks (at 1640) the instance B4 as an instance that it should no longer examine for peer-to-peer interactions while processing E1.

The process then uses (at 1645) the halo polygon of the instance B4 to search the NGT and AGT of the instance E1 to identify the geometries that it should push from the instance E1 into the instance B4. In the set of geometries that it identifies, the process marks the ones that fall into the core of the instance B4 as white geometries and marks the ones that do not fall in the core of instance B4 but fall in its halo as gray geometries.

As shown in FIG. 24, the segments 2205 and 2210 are two wire segments that have portions that fall into the halo polygon of the instance B4. These wire segments were passed down from the root instance. The portion of each of these wire segments that falls into B4's halo is sent to B4 as gray data. This is the second time that these portions have been sent to B4 as gray data. The process 1400 previously sent these portions from the root instance to B4. When a process 1600 is run for the instance B4, it will delete the duplicate data at 1605 when it is creating the geometric trees for the instance B4.

The process deletes (at 1645) from E1's NGT and AGT the white geometries that it identified at 1645 for the instance B4. To the instance B4, it then sends (at 1650) the identified white and gray geometries with the following message:

E1→instance B4: gray and white geometries.

6. Local Processing of E1

After performing 1650 for the instance B4, the process 1600 determines (at 1655) that it has examined all the child instances of the instance E1. Hence, it transitions to 1660, where it calls a process for processing the remaining data in the instance E1. One example of such processing was described above.

7. Processing of the Child Instances of the instance E1

When the message handler of cell A or B determines (at 1545) that all messages have been received for a particular child instance of the instance E1, it will start the process 1600 to analyze the content of the particular child instance. When the instance B1 is processed, the process 1600 will send contribution messages to the instances A2 and A3, and then will initiate the processing of the remaining data within instance B1. Also, when the instance B4 is processed, the process 1600 will need to send contribution messages to the instance A1, and then will initiate the processing of the remaining data within instance B4.

The instances A1, A2, and A3 will need to receive messages from the instance B4 and B1. Hence, the instance A1 will be processed after the instance B4, and the instances A2 and A3 will be processed after the instance B1. Other than this, the processing of the child instances A1, A2, and A3 of the instance E1 is relatively uneventful as these child instances do not have any child instances of their own, and therefore do not require the sending of relay, notification, and contribution messages. Hence, these processes expeditiously reach operation 1660 to process the data within their respective instance A1, A2, or A3.

V. Other Considerations

Different processing of the hierarchical data structure might require different factors to be considered while passing data from parent and peer instances.

A. Halo and Hierarchy Difficulties

Figure 25:
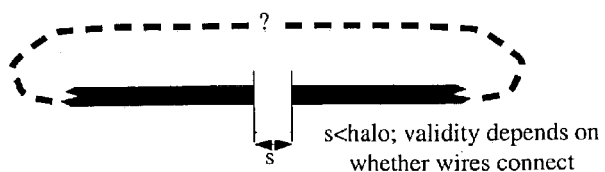
FIG. 25 illustrates a simple example of an arbitrarily large interaction distance.

For instance, some processes cannot assume that interactions are not possible beyond the halos (i.e., these processes can have interactions can traverse distances wider than the halos). FIG. 25 illustrates a simple example of a situation where arbitrarily large distances could be involved. This figure illustrates that spacing rules vary depending on whether the wires 2505 and 2510 are part of the same net or not. The determination might require tracing connectivity an arbitrary distance. This is difficult when hierarchical boundaries are involved, because the content of child instances is invisible during processing of the parent. If part of the path connecting these two wires is contained in a child instance, there is no obvious way for the parent to determine that there is a connection.

Figure 26A:
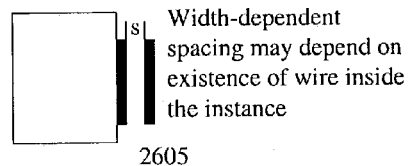
FIGS. 26A and 26B illustrate issues regarding wires that reach the edge of a hierarchical boundary.
Figure 26B:
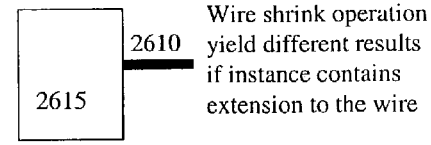

FIGS. 26A and 26B illustrate that wires that reach the edge of a hierarchical boundary also raise issues. FIG. 26A illustrates that the spacing between two wires, which are near the edge of a cell, might depend on the existence of a wire inside the cell. In this example, the halo might be such that the rightmost wire 2605 is outside the cell's halo, depending on how it is defined relative to the "wide wire" widths. FIG. 26B illustrates that a shrink operation on a wire 2610 outside of a cell 2615 yields different results depending on whether the cell contains extension to the wire. In this example, the issue is that shrinking moves the end of the wire, but the location of the end of the wire has been hidden from the parent. If the child contains some of the wire, the end may not move; but if the child does not extend the wire then the end has to move.

Figure 27:
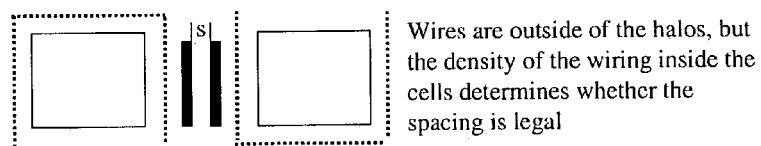
FIG. 27 illustrates that the spacing between two wires outside two cells and their halos can vary depending on the wire density inside the two cells.

Checks that depend on the density of the surrounding region also have similar issues. FIG. 27 illustrates that the spacing between two wires outside two cells and their halos can vary depending on the wire density inside the two cells. Specifically, this figure illustrates an example where the spacing rule varies based on the density of the region. However, the region density cannot necessarily be determined with sufficient accuracy without looking into the cells.

B. Vpins

An observation to make about these difficulties is that practically speaking they all occur across hierarchical boundaries. When they do not, the cell in question can simply look far enough through the data to make a direct determination of the result. This observation leads to the solution: following the Robin Hood theory, the parent should do as much of the computation as it can and then pass the remainder of the computation to the appropriate child for completion.

Figure 28:
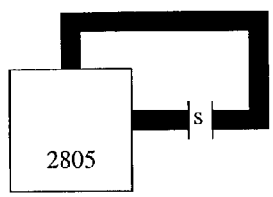
FIG. 28 illustrates an example of a rule that requires determination of whether two wires are part of the same net, where part of the wire is potentially hidden by a child instance.

Consider the simple example illustrated in FIG. 28 of a rule that requires determination of whether two wires are part of the same net, where part of the wire is potentially hidden by a child instance 2805. The parent has determined that the spacing violation should be reported only if the wires are on (or not on) the same net. It cannot make this determination because there could be a connection hidden inside the child instance. Hence, the parent creates vpins at the borders where the wires enter the child instance, and associates with those vpins the computational context for the spacing check. In this case, that would be the actual spacing value and the location (coordinates and hierarchical location) where the resulting error marker should be generated, along with the note that the result is conditional on whether the two vpins end up on different nets. The child instance will then make the determination and report the error if appropriate.

Figure 29:
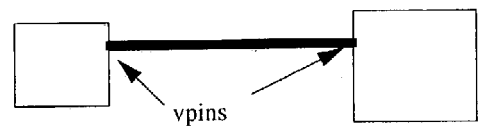
FIG. 29 presents an example of a general case of netlist extraction.

FIG. 29 presents an example of the more general case of netlist extraction. The basic idea is that when a wire reaches the border of two different instances, vpins get created at the borders. The parent informs the children that the vpins are on the same net and informs the larger to pass information to the smaller if information transfer is needed. In the case where the only process being done is netlist assignment, no lateral information transfer needs to occur: the parent assigns the net ID to the wire and passes it to the instances through the vpins; anything attached to the vpin from the inside of the instances will inherit the net ID.

Figure 30:
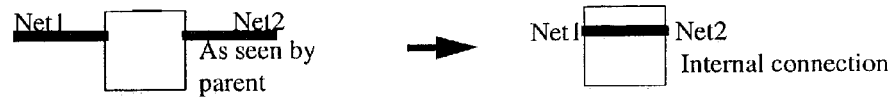
FIG. 30 illustrates a case where some nets will get merged as a result of an operation (e.g., extraction) inside the instance.

It is possible that some nets will get merged as a result of an operation (e.g., extraction) inside the instance. FIG. 30 illustrates one such case. In this case, the child will have to arrange for the merging of one net into the other.

C. Processing Stages

Figure 31:
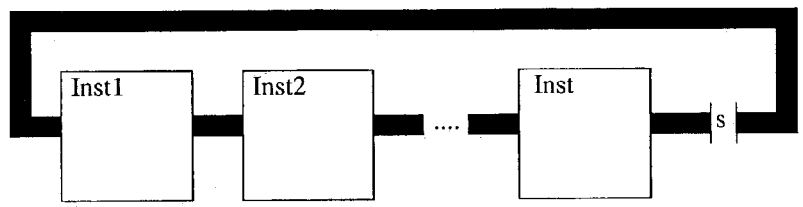
FIG. 31 illustrates an example of a case where there are multiple breaks in the wire due to several instances.

FIG. 31 illustrates an example of a case where there are multiple breaks in the wire due to several instances. For sake of argument, assume that the size relationship is Inst1<Inst2< . . . <InstN in this example. The vpin scheme just discussed would result in a chain of information passing. In effect, the parent would tell Inst1 it needs the information from InstN, and along the line InstI would be receiving information from InstI+1 to pass along to InstI−1. Eventually, with suitable bookkeeping, the result would reach the destination and the result would be computed.

In a real chip, every instance will have multiple fanouts and so there will be a large space of potential paths between the instances. A lot of bookkeeping will need to be done to ensure that all the correct information eventually reaches the destination (particularly accounting for clock, Vdd, and Vdd nets).

Instead of doing this, some embodiments make three passes over the data. The first pass loads the hierarchy and determines the bounding box of each layer of each instance. The second pass runs the above-described data re-distribution processes with a minimal halo size, generating global information such as the density of each region and the net assignments of each wire. The third pass has this information available and runs the remainder of the processing stages. Information percolates down and up in the several passes. For some input formats some of these stages might be unnecessary. For example, in an annotated GDS, the netlist information might already be known, and in an XDEF input, the instance boundaries might also be known.

D. Border Adjustment

Figure 32:
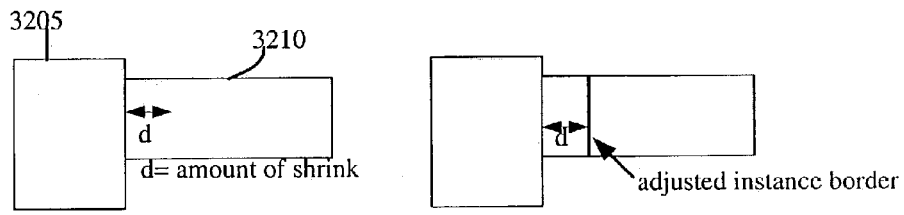
FIGS. 32 and 33 illustrate an example of a wire shrink.
Figure 33:
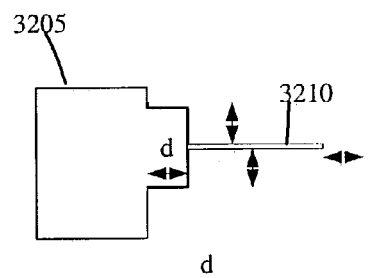

The 'shrink' and 'width-dependent spacing' cases seen earlier both require handling beyond that for the case of netlist extraction. In these cases, insertion of vpins in not sufficient: it is necessary to move the location of the edge of the instance in order to do the processing correctly. FIG. 32 illustrates one such example of a wire shrink, where the edge of the instance 3205 is adjusted to include the ambiguous portion of the wire 3210. After this adjustment, when the wire is split and pushed into the instance, the portion remaining in the parent can be shrunk correctly. This is illustrated in FIG. 33. This figure also illustrates that a vpin is inserted at the border, and the child can do the computation for the portion of the wire that has now been pushed inside the instance as if the border had always been this size.

The handling is exactly the same in the case of the width-dependent spacing example: the border is moved outward to encompass the abutting wire, which then gets pushed into the instance. The width check occurs between the white portion of the wire pushed into the instance (and merged with the instance's content) and the gray parent wire pushed in because of the halo.

For such operations, an instance's boundary should cover its shape at some sufficient resolution. For instance, an L-shaped macro would have an L-shaped boundary whereas an instance containing just the I/O pads but none of the core would have a donut-shaped boundary. On the other hand, an instance that includes all the interconnect wiring on a densely routed third metal layer would be a single solid shape and not a complex shape with lots of tiny holes in it. This extension of the concept of the boundary is useful because pieces will be added and subtracted from the boundary during processing, and these operations will result in non-rectangles even when the original shapes were all rectangles.

E. Bundling Commands

The flow graph of dependencies through the commands would partition the commands into subsets that run together and other subsets that are relatively disjoint. As an example, the rules for checking the interconnect layers will be different from the rules for checking the device layers; both halves of the processing can occur in parallel. The command compiler has to sort this out.

Once it is done, data can be split into different subsets by layers for separate processing when those layers are loaded. This implies that information crossing between layers has to be propagated around just like information crossing hierarchy boundaries, which implies that vpins can connect between layers as well as between instances. The best way to conceptualize this is to think about a via. The via has a connection to the top and bottom layers. The bottom of the via effectively forms a vpin which connects to the bottom layer, and the top of the via effectively forms a vpin which connects to the top layer. It will not make sense all the time to put a vpin at the top and the bottom; the commands themselves will determine which makes more sense.

All of this together says that 'commands' need to be decomposed into subsets: discovery and assignment of vpins, preliminary data gathering to pass at the borders of the vpins, strictly local processing which can be done exclusive of vpin issues, and the final receipt and reconciliation of data at the vpins. Some commands might skip some of these steps, but structurally each command would provide these components and the command compiler would bundle them into appropriate cluster orders.

F. Detection of Duplicate Contexts

When a cell is processing the data for the contexts, it will have the original definition of the cell plus the set of messages describing each instance context available to it. When several instances have received the same set of messages, the result of their processing will be the same. This can be determined by comparing the data values in the messages.

The above-described context-determining technique simply computes a hash value of the messages received by an instance, so that it is easy to check whether the result for a particular set of messages is known. Some embodiments do not take this is adequate but unduly pessimistic approach. Differences in the messages that are significant to one portion of the computation may have no bearing on the result of different computations. Hence, for each of the computations being done (width checks, antenna rules, etc), some embodiments extract the portions of messages that are relevant to it, compute the hash result for the specific computation, and then share the result of each identical computation across instances.

In an ASIC shop the basic cells will be used in many designs, so there is potential benefit to be obtained by caching the results of these hash computations in a persistent external location for sharing across designs. In this case the hash would have to include the exact version information for the cell itself to ensure that identical messages to different versions of the cell didn't cause false errors (or false passes). Though maintaining a distributed database can be difficult, in this case there is one simplifying factor: it is not critical if an attempt to write to the database is lost, since the result will be computed again later if it was worth caching.

G. Degrees of Penetration of Context into Instances

When the contexts of a instance are all duplicates, some embodiments just do the check once and are done processing for all instances, as mentioned above. However, when there are many contexts, the default operation of some embodiments is to simply check each context independently. While this works, there may be cases where it is less efficient than necessary.

Figure 34:
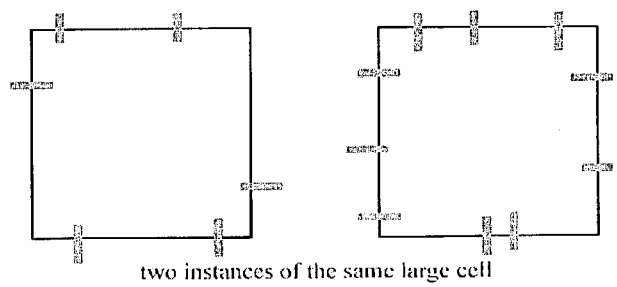
FIG. 34 illustrates a case where there are many contexts for a cell.

Accordingly, other embodiments take a more adaptive approach for cases when that are many contexts. Consider a case illustrated in FIG. 34. In this example, the instances are relatively large and the contexts overlap only a small distance into the interior of the instance. In this case, some embodiments check the central portion of the instance separately for both contexts. These embodiments make this determination by considering the union of the borders of the contexts; if there are "holes" like this central region, then these embodiments can carve that region out for unified processing just as if there had been an empty instance covering that region.

H. Other Hierarchy Operations

In all of the previous hierarchy variants there is an implicit assumption that the design is, in fact, sufficiently hierarchical that the costs of processing hierarchically are hidden inside the gains from avoiding duplicated work. There are cases where this was not true; i.e., cases where flat processing would have been faster. Some embodiments can detect when this occurs and handles it appropriately.

1. Inserting Hierarchy.

One reason for slowdown can be when there is not enough hierarchy. For example, if a 64 Kbit memory cell was described as 64K direct instances of a 1-bit memory cell, a large quantity of border data would get pushed up to the root (in a bottom-up formulation) or pushed down into the cell. Another example might come from a standard cell design, where it could be true that the trio of cells A, B, and C occur adjacent in rows very frequently. For either example, some embodiments detect the pattern and inject new hierarchical cells. In the standard cell case, the combined cell ABC would be instantiated in place of all the trios, and so the AB and BC interactions could be checked once rather than many times. In the case of the RAM cell, constructing a 2×2 cell from the 1-bit cell, then recursively building up 2×2 blocks until the full 64 Kbits is reached, would allow many interactions to be checked many fewer times.

How valuable this is depends in part on the methodology of checking. For example, in the case of a hypothetical top-down hierarchical system which can detect efficiently when instance environments are identical, the RAM cell example might not yield any profit from hierarchical injection due to the fact that basically all the instance environments would be identical and hence combined anyway. It would depend on whether the detect-and-inject logic was faster or slower than the instance environment duplication code.

2. Splitting Cells

Chips basically consist of two main regions: the device region and the interconnect region. For practical purposes, each of these two regions has different rules and different kinds of interactions that can occur. It is then plausible to consider slicing each cell into two components at this boundary, so that there is one new cell containing just the device region and another new cell containing just the interconnect region. The main idea would be to gain speedup through increased parallelization opportunity.

3. Removing Hierarchy

There are some cases where it would be faster to simply flatten a cell. For example, if a cell contains just a single rectangle arguably it will be faster to simply flatten that shape into all instance locations instead of trying to process it hierarchically—especially since that hierarchical processing may eventually just decide that the shape needs to be flattened everywhere as it is shadowed at every instance.

This could be subtler than it seems. Consider a design where redundant vias were added in a post-processing step. For each via layer, a new cell was added. Each of these cells contains the redundant vias for that layer, described as many (hundreds of millions, say) direct instances of a via cell. The via cell itself contains just a single rectangle.

One option would be to flatten this entirely. Another option would be to flatten out the root, leaving millions of instances of the via cell. In a top-down model with duplicated environment detection, this might be faster since the surroundings of a cut rectangle on a via layer are very likely to be similar in all instances.

4. Data and Error Output

Any modification of the hierarchy for the benefit of processing speed needs to be invisible to the user. Just as the goal of hierarchical processing is to present the user with errors as if the design were flat, the goal of hierarchical modification must be to present the user with errors as if there were no modifications. It is too confusing for the user to receive an error message referencing an injected hierarchical cell that the user has not seen before.

I. Incremental and Repetitive Operations

A different approach to gaining performance is to do incremental operations where possible. A single design may have the same checks run on it multiple times; or more precisely, different versions of a single design may each have the same checks run on them. As the design gets closer to completion, the amount of change between revisions decreases. Checking just the changed portion should be significantly faster than checking the entire design.

Just how valuable this is depends on the user's situation. For instance, in a development of a microprocessor, there are likely many iterations through the design, so the potential gain from incremental reprocessing of the same design is high. In an ASIC flow, where things are turned around very rapidly and assumed correct, there is less value because the design will not be done multiple times. However, the underlying cells used in the design will be used in many designs so there might be some gain if that observation could be leveraged.

For incremental processing to be feasible, ideally the tool would have certain capabilities. First, the tool would be able to determine quickly which portions of the design have been changed. Second, the tool would be able to slice out the applicable halo about the changes, do the checks on just those regions, and somehow update the results from the previous run based on the current results. This implies not just slicing of the data, but also appropriate gluing at the borders of the edges (consider a netlist extraction, where the nets have to 'line up' at the edges).

In order to leverage work done in one design during processing of other designs, ideally there has to be a shared data store accessible across the designs in which the results can be stored. While maintaining data integrity in a concurrent-access database is difficult, this problem is slightly simplified if it is not important whether the results are lost, only whether they are corrupted. If results from one design were lost, then the next design would repeat the work but the results would still be correct.

J. Incremental Processing

The embodiments described above lend themselves naturally to incremental processing. The whole basis of the algorithm is the assumption that arbitrary divisions can be placed into cells (the vpins) to cope with the communications necessary across regions of influence. This is essentially identical to the problem of incremental processing, where a slice has been cut through the chip (the changed region) and replaced with a new version. Vpins are formed at the borders of the changed regions, results from the previous run are rippled into those regions, and then the computations for those regions are computed.

There are several assumptions here. The program state at the end of the various processing passes must have been recorded, along with the data values passed through the vpins. Results generated at any point in the processing must be associated with those steps of the processing so that if the processing is redone, the results can be eliminated and new results computed.

The other key item is the ability to short-circuit the command processing as much as possible. The initial values flowing into the borders of the incrementally changed region can just have been preserved from the previous run, but as results flow out of that region they will percolate through the rest of the design. The processing driver has to be able to determine when those outputs can impact results made outside the changed region as well as when the cannot, in order to prevent unnecessary processing from occurring. This implies that the information available to the command driver has to include a clear definition of which commands will always produce the same output, given the same input.

VI. Computer System

Figure 35:
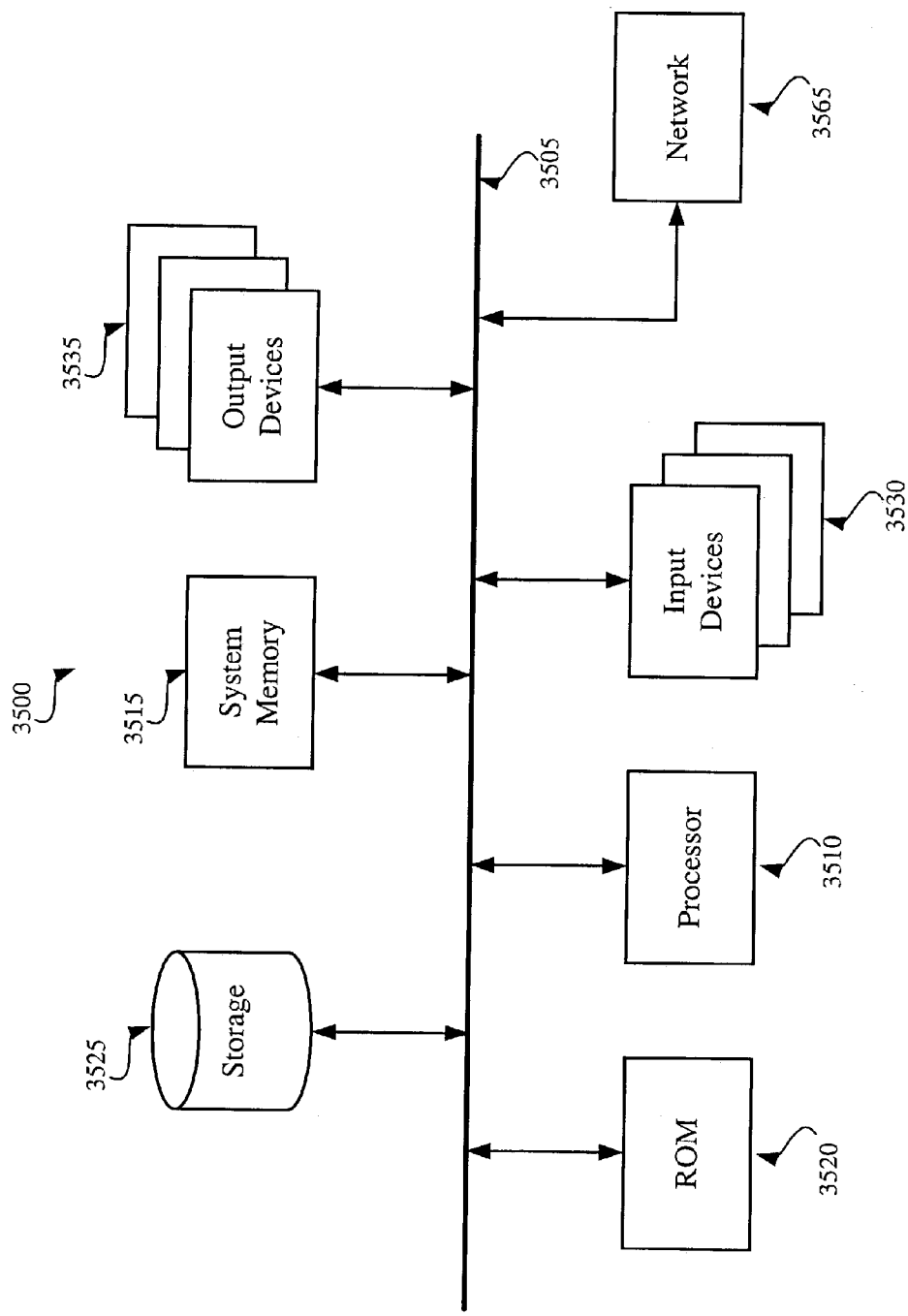
FIG. 35 conceptually illustrates a computer system with which some embodiments of the invention are implemented.

FIG. 35 conceptually illustrates a computer system with which some embodiments of the invention are implemented. Computer system 3500 includes a bus 3505, a processor 3510, a system memory 3515, a read-only memory 3520, a permanent storage device 3525, input devices 3530, and output devices 3535.

The bus 3505 collectively represents all system, peripheral, and chipset buses that communicatively connect the numerous internal devices of the computer system 3500. For instance, the bus 3505 communicatively connects the processor 3510 with the read-only memory 3520, the system memory 3515, and the permanent storage device 3525.

From these various memory units, the processor 3510 retrieves instructions to execute and data to process in order to execute the processes of the invention. The read-only-memory (ROM) 3520 stores static data and instructions that are needed by the processor 3510 and other modules of the computer system. The permanent storage device 3525, on the other hand, is read-and-write memory device. This device is a non-volatile memory unit that stores instruction and data even when the computer system 3500 is off. Some embodiments of the invention use a mass-storage device (such as a magnetic or optical disk and its corresponding disk drive) as the permanent storage device 3525. Other embodiments use a removable storage device (such as a floppy disk or zip® disk, and its corresponding disk drive) as the permanent storage device. Like the permanent storage device 3525, the system memory 3515 is a read-and-write memory device. However, unlike storage device 3525, the system memory is a volatile read-and-write memory, such as a random access memory. The system memory stores some of the instructions and data that the processor needs at runtime. In some embodiments, the invention's processes are stored in the system memory 3515, the permanent storage device 3525, and/or the read-only memory 3520.

The bus 3505 also connects to the input and output devices 3530 and 3535. The input devices enable the user to communicate information and select commands to the computer system. The input devices 3530 include alphanumeric keyboards and cursor-controllers. The output devices 3535 display images generated by the computer system. For instance, these devices display IC design layouts. The output devices include printers and display devices, such as cathode ray tubes (CRT) or liquid crystal displays (LCD).

Finally, as shown in FIG. 35, bus 3505 also couples computer 3500 to a network 3565 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3500 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A method of processing a hierarchical data structure that includes a parent data set and first and second child data sets of the parent data set, wherein each of the parent and first and second child data sets includes a plurality of data subsets that include data that relate to a design layout, the method comprising:
   a) identifying a first data subset in the second child data set that is not in the first child data set and that is relevant for the processing of the data subsets within the first child data set;
   b) assigning the first data subset to the first child data set;
   c) processing the first child data set based on the data subsets included in the first child data set and assigned to the first child data set;
   d) removing the first data subset from the second child data set; and
   e) processing the second child data set by examining the remaining data subsets in the second child data set.

2. A method of processing a hierarchical data structure that includes a parent data set and first and second child data sets of the parent data set, wherein each of the parent and first and second child data sets includes a plurality of data subsets that include data that relate to a design layout, the method comprising:
   a) identifying a first data subset in the second child data set that is not in the first child data set and that is relevant for the processing of the data subsets within the first child data set;
   b) assessing the complexity of the first data set and the complexity of the second data set based on a set of indicia;
   c) determining whether the first data set is less complex than the second data set;
   d) if the first data set is less complex than the second data set assigning the first data subset to the first child data set;
   e) processing the first child data set based on the data subsets included in the first child data set and assigned to the first child data set.

3. The method of claim 1, wherein the first data subset is not part of any other data subset in the second child data set.

4. The method of claim 1, wherein the first data subset is a portion of a second data subset that is in the second child data set, wherein identifying the first data subset comprises identifying the portion of the second data subset that is relevant for the processing of the first child data set.

5. A method of analyzing a design layout by processing a hierarchical data structure that includes a parent data set and first and second child data sets of the parent data set, wherein each of the parent and first and second child data sets includes a plurality of data subsets that include data that relate to a design layout, and wherein the first child data set is a parent data set of a third child data set, the method comprising:
   a) identifying a first data subset in the second child data set that is not in the first child data set and that is relevant for the processing of the data subsets within the first child data set;
   b) assigning the first data subset to the first child data set;
   c) processing the first child data set based on the data subsets included in the first child data set and assigned to the first child data set;
   d) identifying a second data subset in the first child data set that is not in the third child data set and that is relevant for the processing of the data subsets within the third child data set;
   e) assigning the identified second data subset to the third child data set.

6. The method of claim 5, wherein the second data subset is identified and assigned before processing the first child data set.

7. The method of claim 6, wherein the second data subset is at least a portion of the first data subset.

8. The method of claim 7, wherein the second data subset is the portion of the first data subset that is relevant for the processing of the data subsets within the third child data set.

9. The method of claim 1, wherein each child set is at least one data subset within the parent data set.

10. A method of analyzing a design layout by processing a hierarchical data structure that includes a parent data set and first and second child data sets of the parent data set, wherein each of the parent and first and second child data sets includes a plurality of data subsets that include data that relate to a design layout, the method comprising:
    a) identifying a first data subset in the parent data set that is not in the first child data set and that is relevant for the processing of the data subsets within the first child data set;
    b) assigning the identified first data subset to the first child data set;
    c) identifying a second data subset in the second child data set that is not in the first child data set and that is relevant for the processing of the data subsets within the first child data set;
    d) assigning the second data subset to the first child data set;
    e) processing the first child data set based on the data subsets included in the first child data set and assigned to the first child data set.

11. A computer readable medium that stores a computer program for processing a hierarchical data structure that includes a parent data set and first and second child data sets of the parent data set, wherein each of the parent and first and second child data sets includes a plurality of data subsets, the computer program comprising a set of instructions for:
    a) identifying a first data subset in the second child data set that is not in the first child data set and that is relevant for the processing of the data subsets within the first child data set;
    b) assigning the first data subset to the first child data set;

c) processing the first child data set based on the data subsets included in the first child data set and assigned to the first child data set;

d) removing the first data subset from the second child data set; and e) processing the second child data set by examining the remaining data subsets in the second child data set.

12. The computer readable medium of claim 11, wherein the computer program further comprises sets of instructions for:

a) from the parent data set, identifying a second data subset that is not in the first child data set and that is relevant for the processing of the data subsets within the first child data set;

b) assigning the identified second data subset to the first child data set.

13. The computer readable medium of claim 12, wherein the computer program further comprises sets of instructions for:

a) removing the second data subset from the parent data set;

b) processing the parent data set by examining the remaining data subsets in the parent data set.

14. The computer readable medium of claim 13, wherein the computer program further comprises sets of instructions for:

a) from the parent data set, identifying a third data subset that is not in the first child data set and that is relevant for the processing of the data subsets within the first child data set;

b) assigning the identified third data subset to the first child data set;

c) wherein the set of instructions for examining the remaining data subsets in the parent data set comprises a set of instructions for examining the third data subset.

15. The method of claim 10 further comprising:

a) removing the first data subset from the parent data set; and b) processing the parent data set by examining the remaining data subsets in the parent data set.

16. The method of claim 10 further comprising:

a) removing the second data subset from the second child set; and b) processing the second child set by examining the remaining data subsets in the parent data set.

17. The method of claim 2, wherein said indicia comprise size of a given data set.

18. The method of claim 2, wherein said indicia comprise geometrical complexity of a given data set.

* * * * *

UNITED STATES PATENT AND TRADEMARK OFFICE
CERTIFICATE OF CORRECTION

| | | |
|---|---|---|
| PATENT NO. | : 7,155,440 B1 | Page 1 of 1 |
| APPLICATION NO. | : 10/443556 | |
| DATED | : December 26, 2006 | |
| INVENTOR(S) | : Tom Kronmiller et al. | |

It is certified that error appears in the above-identified patent and that said Letters Patent is hereby corrected as shown below:

Column 11,
Lines 56-57 read "Different embodiments compute hash values different differently."
should read (correction of language) -- Different embodiments compute hash values differently. --

Column 12,
Lines 2-4 read "foreach coordinate in the geometry's description, generate a hash value based on the coordinate and accumulate this value iin Result,"
should read (coorrection of preposition) -- foreach coordinate in the geometry's description, generate a hash value based on the coordinate and accumulate this value in Result, --

Column 35,
Lines 55-57 read "d) if the first data set is less complex than the second data set assigning the first data subset to the first child data set;"
should read (corrections of punctuation) -- d) if the first data set is less complex than the second data set, assigning the first data subset to the first child data set; --

Signed and Sealed this

Twenty-first Day of August, 2007

JON W. DUDAS
*Director of the United States Patent and Trademark Office*